(12) United States Patent
Makihara

(10) Patent No.: US 8,711,536 B2
(45) Date of Patent: Apr. 29, 2014

(54) VOLTAGE DETECTION APPARATUS AND COMBINATION CIRCUIT

(75) Inventor: Tetsuya Makihara, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 218 days.

(21) Appl. No.: 13/423,307

(22) Filed: Mar. 19, 2012

(65) Prior Publication Data

US 2012/0250203 A1  Oct. 4, 2012

(30) Foreign Application Priority Data

Mar. 30, 2011 (JP) ................................. 2011-75548
Feb. 23, 2012 (JP) ................................. 2012-37373

(51) Int. Cl.
*G01R 31/36* (2006.01)

(52) U.S. Cl.
USPC .......................... 361/93.1; 324/434; 320/116

(58) Field of Classification Search
USPC ....................................................... 361/93.1
See application file for complete search history.

(56) References Cited

U.S. PATENT DOCUMENTS

| | | | |
|---|---|---|---|
| 4,678,939 A | 7/1987 | Laue | |
| 4,748,419 A | 5/1988 | Somerville | |
| 5,530,336 A * | 6/1996 | Eguchi et al. | 320/118 |
| 6,525,566 B2 | 2/2003 | Haigh et al. | |
| 7,567,116 B2 * | 7/2009 | Yoshio | 327/535 |
| 7,663,375 B2 * | 2/2010 | Yonezawa | 324/434 |
| 2008/0150516 A1 | 6/2008 | Yonezawa | |
| 2009/0058505 A1 * | 3/2009 | Yoshio | 327/535 |
| 2012/0182019 A1 * | 7/2012 | Nakagawara | 324/426 |
| 2012/0206105 A1 * | 8/2012 | Nishizawa et al. | 320/134 |

FOREIGN PATENT DOCUMENTS

| | | |
|---|---|---|
| JP | A-2002-286766 | 10/2002 |
| JP | A-2004-245743 | 9/2004 |
| JP | A-2009-216447 | 9/2009 |

OTHER PUBLICATIONS

U.S. Appl. No. 13/307,047, filed Nov. 30, 2011, Makihara.

* cited by examiner

*Primary Examiner* — Ronald W Leja
(74) *Attorney, Agent, or Firm* — Posz Law Group, PLC

(57) ABSTRACT

A voltage detection apparatus includes an operational amplifier, first and second switches coupled between a terminal of a detection target voltage source and a common node, a first capacitor including a plurality of capacitor elements coupled in series between the common node and an inverting input terminal of the operational amplifier, a third switch and a second capacitor, which are coupled between the inverting input terminal and an output terminal of the operational amplifier, a reference voltage selection circuit which applies one of a first reference voltage and a second reference voltage differing from one another to a non-inverting input terminal of the operational amplifier, and a controller which is capable of selecting a voltage detection mode and a self-diagnostic mode.

14 Claims, 16 Drawing Sheets

| CASE | C1 | C2 | VOUT |
|---|---|---|---|
| CASE IVa | 1pF | 1pF | 1.5V |
| CASE IVb | 1.5pF | 1pF | 1.75V |
| CASE IVc | 3pF | 1pF | 2.5V |
| CASE IVd | 1pF | 1.5pF | 1.33V |
| CASE IVe | 1pF | 3pF | 1.17V |

FIG. 8A

| | NORMAL | \multicolumn{6}{c}{NUMBER OF SHORT-CIRCUIT CAPACITOR ELEMENT} |
|---|---|---|---|---|---|---|---|
| | NORMAL | C1A 1 | C1A 2 | C1B 1 | C1B 2 | C2A 1 | C2B 1 |
| C1A | 1pF | 1.5pF | 3pF | 1pF | 1pF | 1pF | 1pF |
| C2A | 1pF | 1pF | 1pF | 1pF | 1pF | 1.5pF | 1pF |
| C1B | 1pF | 1pF | 1pF | 1.5pF | 3pF | 1pF | 1pF |
| C2B | 1pF | 1pF | 1pF | 1pF | 1pF | 1pF | 1.5pF |
| VOP-VOM | −1.25V | −1.11111V | −0.83333V | −1.38889V | −1.66667V | −1.36364V | −1.13636V |

FIG. 8B

| | NORMAL | \multicolumn{6}{c}{NUMBER OF SHORT-CIRCUIT CAPACITOR ELEMENT} |
|---|---|---|---|---|---|---|---|
| | NORMAL | C1A 1 | C1A 2 | C1B 1 | C1B 2 | C2A 1 | C2B 1 |
| C1A | 1pF | 1.5pF | 3pF | 1pF | 1pF | 1pF | 1pF |
| C2A | 1pF | 1pF | 1pF | 1pF | 1pF | 1.5pF | 1pF |
| C1B | 1pF | 1pF | 1pF | 1.5pF | 3pF | 1pF | 1pF |
| C2B | 1pF | 1pF | 1pF | 1pF | 1pF | 1pF | 1.5pF |
| VOP-VOM | −0.625V | −0.41667V | 0V | −0.83333V | −1.25V | −0.79545V | −0.45455V |

VOLTAGE DETECTION APPARATUS AND COMBINATION CIRCUIT

CROSS REFERENCE TO RELATED APPLICATIONS

The present application is based on and claims priority to Japanese Patent Applications No. 2011-75548 filed on Mar. 30, 2011 and No. 2012-37373 filed on Feb. 23, 2012, the contents of which are incorporated in their entirety herein by reference.

TECHNICAL FIELD

The present disclosure relates to a voltage detection apparatus and a combination circuit.

BACKGROUND

An assembled battery configured by coupling a plurality of secondary batteries (unit batteries) in series is mounted in a hybrid vehicle or an electric vehicle. For this kind of assembled battery, it is necessary to individually detect the voltage of each secondary battery for the purposes of calculating the capacitance, and a conservation and management, of each secondary battery. However, because the number of series connections of the secondary batteries configuring the assembled battery is very large in the above-described application, the potential of the secondary batteries increases in accordance with a connection position in the assembled battery, and a high voltage is applied to a secondary battery voltage detection device.

JP-A-2008-145180 (corresponding to US 2008/0150516 A) discloses a voltage detection circuit including an operational amplifier, a first capacitor, one end of which is coupled to an inverting input terminal of the operational amplifier, a second capacitor and a discharge circuit, which are coupled between the inverting input terminal and an output terminal of the operational amplifier, and switches coupled one between each of terminals of unit batteries and the other end of the first capacitor. A switch between a plus terminal of a unit battery and the first capacitor, and the discharge circuit, are turned on, thus charging the first capacitor, and subsequently, in a condition in which the discharge circuit is turned off, a switch between a minus terminal of the unit battery and the first capacitor is turned on in place of the above-described switch, thus detecting the voltage of the unit battery.

A digital isolator wherein a differential driver and a differential amplifier are combined by a first capacitor is disclosed in U.S. Pat. No. 4,748,419.

SUMMARY

It is an object of the present disclosure to provide a voltage detection apparatus, and a combination circuit, which can self-diagnose a capacitor short-circuit fault.

A voltage detection apparatus according to an aspect of the present disclosure includes an operational amplifier, first to third switches, first and second capacitors, a reference voltage selection circuit, and a controller. The first switch is coupled between a high potential side terminal of a detection target voltage source and a common node. The second switch is coupled between a low potential side terminal of the detection target voltage source and the common node. The first capacitor includes a plurality of capacitor elements coupled in series between the common node and an inverting input terminal of the operational amplifier. The third switch is coupled between the inverting input terminal and an output terminal of the operational amplifier. The second capacitor is coupled between the inverting input terminal and output terminal of the operational amplifier. The reference voltage selection circuit selects one of a first reference voltage and a second reference voltage differing from one another, and applies a selected reference voltage to a non-inverting input terminal of the operational amplifier. The controller can select a voltage detection mode and a self-diagnostic mode.

In the voltage detection mode, the controller uses the reference voltage selection circuit to select the first reference voltage and sets charge in the first capacitor by closing the third switch and closing the first switch, and subsequently, the controller detects an interterminal voltage of the detection target voltage source based on an output voltage of the operational amplifier after opening the third switch and the first switch and closing the second switch.

In the self-diagnostic mode, the controller uses the reference voltage selection circuit to select one of the first reference voltage and the second reference voltage and sets charge in the first capacitor by closing the third switch and closing one of the first switch and second switch, and subsequently, the controller carries out a fault diagnosis based on an output voltage of the operational amplifier after opening the third switch and using the reference voltage selection circuit to select the other one of the first reference voltage and second reference voltage.

A voltage detection apparatus according to another aspect of the present disclosure includes an operational amplifier, first and second switches, first and second upstream capacitors, first and second downstream capacitors, first and second parallel switches, first and second series switches, a node switch, first and second reference voltage selection circuits, and a controller. The operational amplifier has a differential output configuration. The first switch is coupled between one terminal of a detection target voltage source and a first common node. The second switch is coupled between the other terminal of the detection target voltage source and a second common node. The first upstream capacitor includes a plurality of capacitor elements coupled in series between the first common node and an inverting input terminal of the operational amplifier. The second upstream capacitor includes a plurality of capacitor elements coupled in series between the second common node and a non-inverting input terminal of the operational amplifier. The first parallel switch is coupled between the inverting input terminal and a non-inverting output terminal of the operational amplifier. The second parallel switch is coupled between the non-inverting input terminal and an inverting output terminal of the operational amplifier. The first downstream capacitor and first series switch are coupled in series between the inverting input terminal and non-inverting output terminal of the operational amplifier. The second downstream capacitor and second series switch are coupled in series between the non-inverting input terminal and inverting output terminal of the operational amplifier. The node switch is coupled between the first common node and second common node. The first reference voltage selection circuit is capable of applying a first reference voltage or a second reference voltage to a common connection point of the first downstream capacitor and the first series switch. The second reference voltage selection circuit is capable of applying a third reference voltage and a fourth reference voltage to a common connection point of the second downstream capacitor and the second series switch. The controller is selectable a voltage detection mode and a self-diagnostic mode.

In the voltage detection mode, the controller opens the first series switch, the second series switch, and the node switch, uses the first reference voltage selection circuit and the second reference voltage selection circuit to apply the first reference voltage and the third reference voltage respectively, and closes the first parallel switch and the second parallel switch and closes the first switch and the second switch, thereby setting charge in the first upstream capacitor, the second upstream capacitor, the first downstream capacitor, and the second downstream capacitor, and subsequently, the controller detects an interterminal voltage of the detection target voltage source based on a differential output voltage of the operational amplifier after opening the first switch, the second switch, the first parallel switch, and the second parallel switch, stopping the voltage application using the first reference voltage selection circuit and the second reference voltage selection circuit, and closing the first series switch, the second series switch, and the node switch.

In the self-diagnostic mode, the controller closes the node switch after having opened at least one of the first switch and the second switch, closes the first parallel switch and the second parallel switch, opens the first series switch and the second series switch, and uses the first reference voltage selection circuit and the second reference voltage selection circuit to apply the second reference voltage and the fourth reference voltage respectively, thereby setting charge in the first upstream capacitor, the second upstream capacitor, the first downstream capacitor, and the second downstream capacitor, and subsequently, the controller carries out a fault diagnosis based on a differential output voltage of the operational amplifier after opening the first parallel switch and the second parallel switch, stopping the voltage application using the first reference voltage selection circuit and the second reference voltage selection circuit, and closing the first series switch and the second series switch.

A combination circuit according to another aspect of the present disclosure includes first and second capacitors, an operational amplifier, a diagnostic switch, a parallel switch, a reference voltage selection circuit, and a controller. The first capacitor includes a plurality of capacitor elements coupled in series between a signal output node of a first circuit which operates in a first power supply system and a signal input node of a second circuit which operates in a second power supply system. The diagnostic switch is coupled between the signal input node and an inverting input terminal of the operational amplifier. The parallel switch is coupled between the inverting input terminal and an output terminal of the operational amplifier. The second capacitor includes one capacitor element coupled, or a plurality of capacitor elements coupled in series, between the inverting input terminal and output terminal of the operational amplifier. The reference voltage selection circuit selects one of a first reference voltage and a second reference voltage differing from one another, and applies a selected reference voltage to a non-inverting input terminal of the operational amplifier. The controller is capable of selecting a signal transmission mode and a self-diagnostic mode.

In the signal transmission mode, the controller opens the diagnostic switch, thereby transmitting a signal from the signal output node to the signal input node.

In the self-diagnostic mode, the controller outputs a constant voltage from the first circuit to the signal output node, uses the reference voltage selection circuit to select one of the first reference voltage and the second reference voltage, and closes the diagnostic switch and the third switch, thereby setting charge in the first capacitor, and subsequently, the controller carries out a fault diagnosis based on an output voltage of the operational amplifier after opening the third switch, and using the reference voltage selection circuit to select the other one of the first reference voltage and second reference voltage.

A combination circuit according to another aspect of the present disclosure includes first and second upstream capacitors, an operational amplifier, first and second diagnostic switches, first and second parallel switches, first and second series switches, first and second downstream capacitors, first and second reference voltage selection circuits, and a controller. Each of the first upstream capacitor and second upstream capacitor includes a plurality of capacitor elements coupled in series between a differential signal output node of a first circuit which operates in a first power supply system and a differential signal input node of a second circuit which operates in a second power supply system. The operational amplifier has a differential output configuration. The first diagnostic switch is coupled between one of the differential signal input nodes and an inverting input terminal of the operational amplifier. The second diagnostic switch is coupled between the other one of the differential signal input nodes and a non-inverting input terminal of the operational amplifier. The first parallel switch is coupled between the inverting input terminal and a non-inverting output terminal of the operational amplifier. The second parallel switch is coupled between the non-inverting input terminal and an inverting output terminal of the operational amplifier. The first downstream capacitor includes one or a plurality of series capacitor elements. The first downstream capacitor and first series switch are coupled between the inverting input terminal and non-inverting output terminal of the operational amplifier. The second downstream capacitor includes one or a plurality of series capacitor elements. The second downstream capacitor and second series switch are coupled between the non-inverting input terminal and inverting output terminal of the operational amplifier. The first reference voltage selection circuit is capable of applying a first reference voltage to a common connection point of the first downstream capacitor and the first series switch. The second reference voltage selection circuit is capable of applying a second reference voltage to a common connection point of the second downstream capacitor and the second series switch. The controller is selectable a signal transmission mode and a self-diagnostic mode.

In the signal transmission mode, the controller opens the first diagnostic switch and the second diagnostic switch, thereby transmitting a signal from the differential signal output node to the differential signal input node.

In the self-diagnostic mode, the controller outputs a constant voltage from the first circuit to the differential signal output node, closes the first parallel switch and the second parallel switch, opens the first series switch and the second series switch, and uses the first reference voltage selection circuit and the second reference voltage selection circuit to apply the first reference voltage and the second reference voltage respectively, thereby setting charge in the first upstream capacitor, the second upstream capacitor, the first downstream capacitor, and the second downstream capacitor, and subsequently, the controller carries out a fault diagnosis based on a differential output voltage of the operational amplifier after opening the first parallel switch and the second parallel switch, stopping the voltage application using the first reference voltage selection circuit and the second reference voltage selection circuit, and closing the first series switch and the second series switch.

BRIEF DESCRIPTION OF THE DRAWINGS

Additional objects and advantages of the present disclosure will be more readily apparent from the following detailed description when taken together with the accompanying drawings. In the drawings:

FIGS. 8A and 8B are diagrams each showing a relationship between short-circuit faults in first and second capacitors and output voltages in the self-diagnostic mode of the second embodiment;

DETAILED DESCRIPTION

The inventor of the present disclosure has found out the following with respect to the conventional technology. With the voltage detection circuit described in JP-A-2008-145180, there is a danger that a high battery voltage is applied directly to a low-voltage operational amplifier when there is a short-circuit fault in the first capacitor due to age deterioration, a breakdown voltage shortage, or the like. Also, even by observing an output voltage, it is not possible to determine whether there is a short-circuit fault in the capacitor or whether a battery voltage has changed.

With the isolator described in U.S. Pat. No. 4,748,419, when there is a short-circuit fault in the first capacitor due to age deterioration, a breakdown voltage shortage, or the like, it is difficult to transmit a signal, and there is a danger that a high voltage is applied to a low voltage circuit. Also, even by observing a transmitted signal, it is not possible to determine whether there is a short-circuit fault in the capacitor or whether a transmitted signal has changed.

The present disclosure has been made bearing in mind the above-described situations.

First Embodiment

Hereafter, a description will be given, while referring to FIGS. 1 to 4, of a first embodiment.

Figure 1:
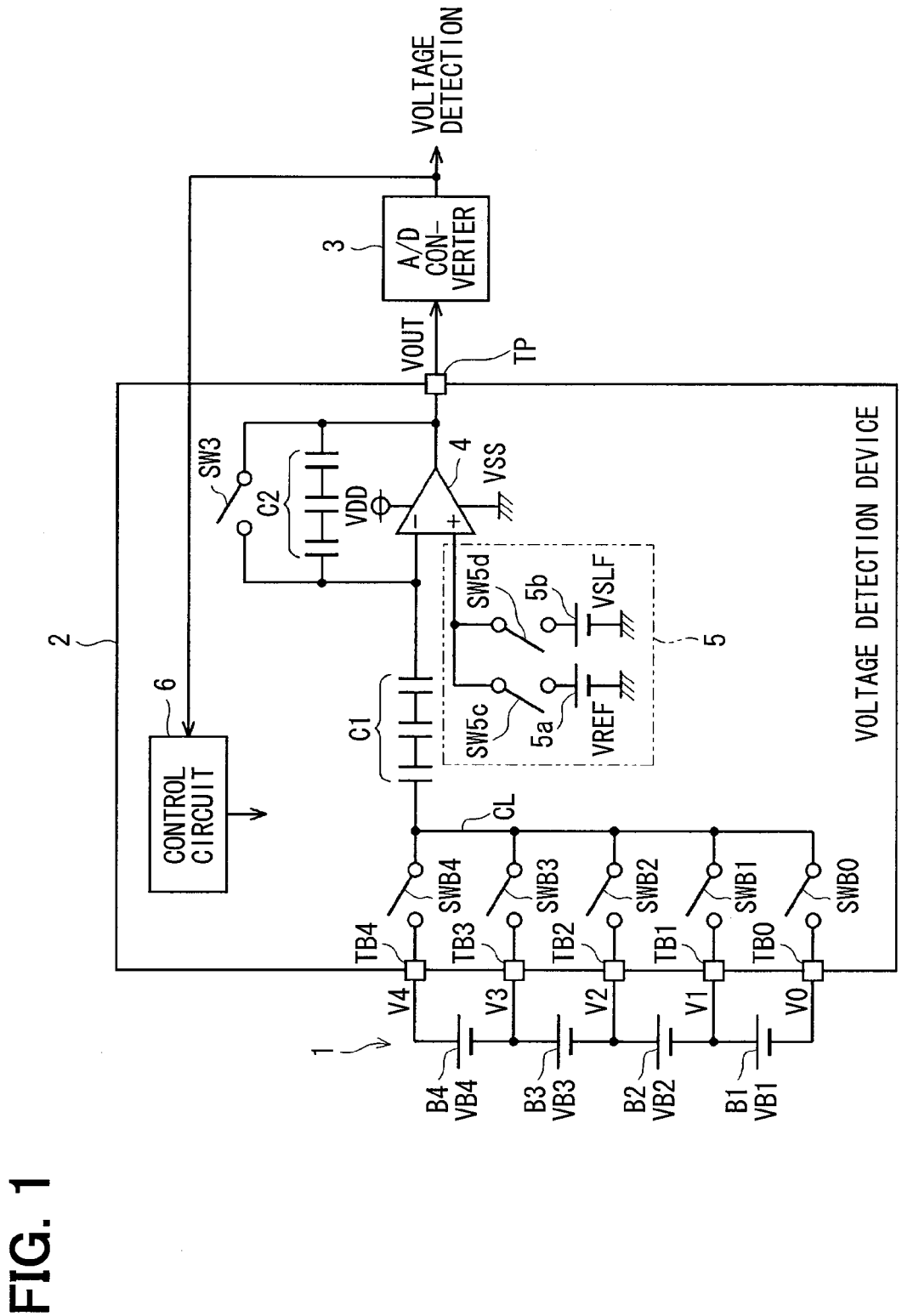
FIG. 1 is a diagram showing a voltage detection device according to a first embodiment of the present disclosure.

FIG. 1 shows a configuration of an assembled battery voltage detection device. An assembled battery 1, being mounted in a hybrid automobile or an electric automobile, supplies power to an electric motor via an inverter. The actual assembled battery 1 has a configuration wherein a great number of lithium-ion secondary batteries, nickel hydride secondary batteries, or the like, are coupled in series with the same polarity, but a low potential side battery cell B1 to a high potential side battery cell B4 are shown herein for simplicity of description.

A lithium-ion secondary battery is such that the state of charge (SOC), and thus the cell voltage, of each battery cell vary depending on an individual difference in capacitance, a difference in self-discharge characteristics, or the like, of each battery cell. For this kind of assembled battery 1, it is necessary to individually detect the voltage of each secondary battery for the purposes of calculating the capacitance, and a conservation and management (for example, battery voltage equalization), of each secondary battery.

Terminals of the battery cells B1 to B4 (detection target voltage sources, unit batteries) are coupled respectively to terminals TB0 to TB4 of a voltage detection device 2 for the assembled battery 1. The voltages of the terminals TB0 to TB4 are V0 to V4 respectively. The voltage detection device 2 operates in a voltage detection mode which detects a voltage VBn of each battery cell Bn (n=1, 2, 3, and 4) configuring the assembled battery 1, and outputs the detected voltage as VOUT from an output terminal TP to an A/D converter 3, and in a self-diagnostic mode which diagnoses a short-circuit fault in capacitors C1 and C2, to be described hereafter.

The voltage detection device 2 is configured as an integrated circuit (IC) along with a circuit such as the A/D converter 3. The voltage detection device 2 includes an operational amplifier 4 which operates by receiving a supply of a power supply voltage VDD with a ground potential VSS as a reference. A reference voltage selection circuit 5 includes a reference voltage generation circuit 5a which generates a first reference voltage VREF, a reference voltage generation circuit 5b which generates a second reference voltage VSLF, and switches SW5c and SW5d which select one of the reference voltages VREF and VSLF, and give the one selected to a non-inverting input terminal of the operational amplifier 4. The first reference voltage VREF and the second reference voltage VSLF are of differing voltage values.

A switch SWBn is coupled between each terminal TBn (n=0, 1, 2, 3, and 4) and a common line CL (a common node).

A switch SWBn coupled to a high potential side terminal TBn corresponds to a first switch, and a switch SWBn−1 coupled to a low potential side terminal TBn−1 corresponds to a second switch, for each battery cell Bn. That is, the assembled battery 1 wherein the battery cells Bn are coupled in series is designed so that the first and second switches necessary for each battery cell Bn are used in common with the second and first switches of battery cells Bn+1 and Bn−1 adjacent to the battery cell Bn.

A first capacitor C1 is coupled between the common line CL and an inverting input terminal of the operational amplifier 4. Also, a second capacitor C2 and a third switch SW3 are coupled in parallel between the inverting input terminal and an output terminal of the operational amplifier 4. The first and second capacitors C1 and C2 are configured by coupling a plurality of capacitor elements in series, in order to prevent an all-short-circuit fault wherein all the terminals are short-circuited. Each of the above-described switches is configured of an MOS transistor, and a switching of the switches is carried out by a control circuit 6 acting as a controller.

Figure 2:
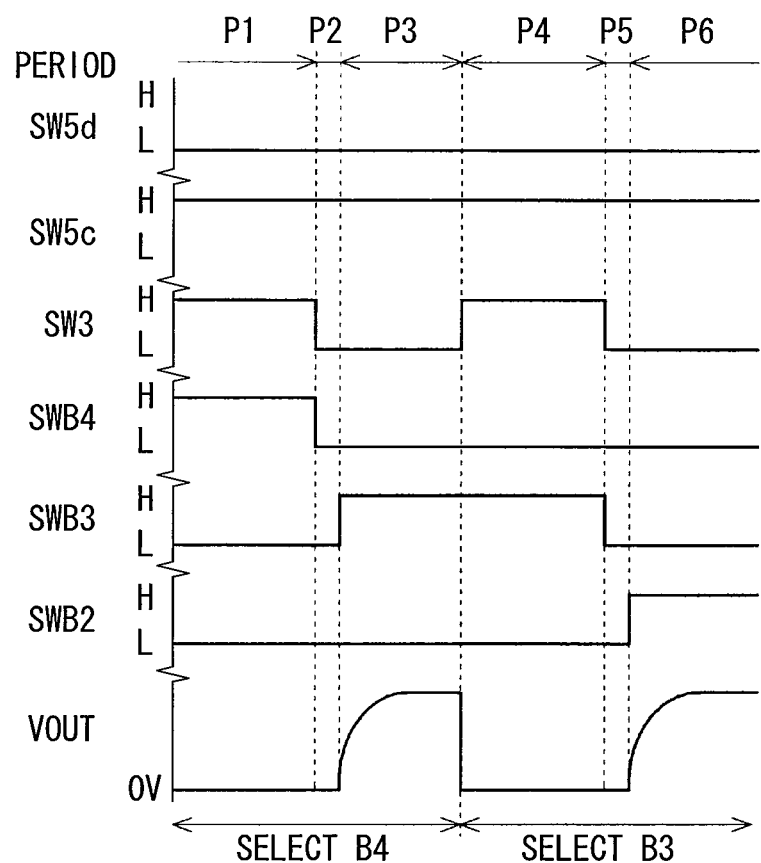
FIG. 2 is a diagram showing conditions of switches and a waveform of an output voltage, in a voltage detection mode, of the voltage detection device according to the first embodiment.
Figures 3, 4:
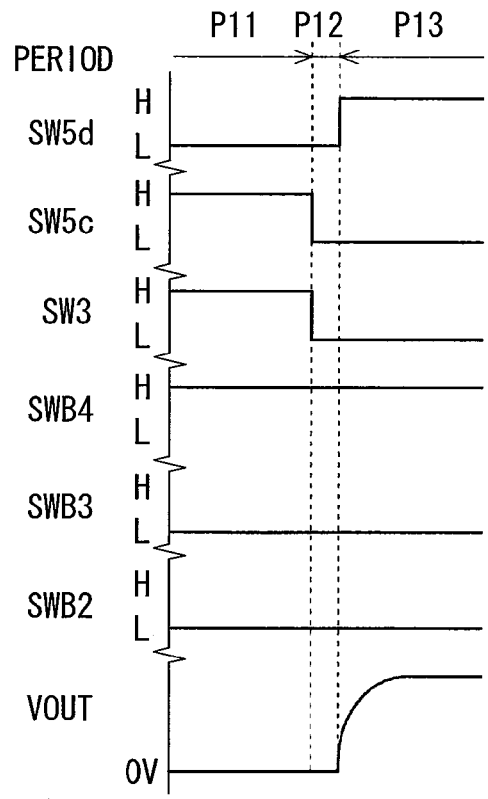
FIG. 3 is a diagram showing conditions of switches and a waveform of an output voltage, in a self-diagnostic mode, of the voltage detection device according to the first embodiment.
FIG. 4 is a diagram showing a relationship between short-circuit faults in first and second capacitors and output voltages in the self-diagnostic mode of the first embodiment.

Next, a description will be given, while referring to FIGS. 2 to 4, of operations and advantages of the embodiment. FIGS. 2 and 3 each show ON and OFF conditions (an H level indicates the ON condition, and an L level indicates the OFF condition) of the switches, and a waveform of the output voltage VOUT, in the voltage detection mode and the self-diagnostic mode.

In the voltage detection mode shown in FIG. 2, the control circuit 6, while switching switches, repeatedly detects the cell voltages VB1 to VB4 in descending order, and outputs them to the A/D converter 3. In this mode, the control circuit 6 fixes the switch SW5c of the reference voltage selection circuit 5 to ON and the switch SW5d to OFF, and selects and outputs the first reference voltage VREF.

When detecting the voltage VB4 of the battery cell B4, the control circuit 6 turns on the third switch SW3, and turns on the first switch SWB4 for the battery cell B4, thereby setting charge in the first capacitor C1 (period P1). Subsequently, the control circuit 6 turns off the switch SWB4 and the third switch SW3 (non-overlap period P2), and turns on the second switch SWB3 for the battery cell B4, thereby carrying out a charge redistribution (period P3).

A general expression for a conservation of charge between period P2 and period P3 is Expression (1) when the capacitance of the first capacitor is taken to be C1, and the capacitance of the second capacitor is taken to be C2. When detecting in, for example, the battery cell B4, Vn=V4, Vn−1=V3, and Vn−Vn−1=VB4.

$$C1(Vn-VREF)=C1(Vn-1-VREF)+C2(VOUT-VREF) \quad (1)$$

Expression (2) is obtained by solving Expression (1).

$$VOUT=C1/C2(Vn-Vn-1)+VREF \quad (2)$$

The A/D converter 3, after a switching to period P3, A/D converts a stabilized output voltage VOUT of the operational amplifier 4 expressed by Expression (2). The control circuit 6 can detect the cell voltage VB4 based on this A/D converted value. The control circuit 6 detects the voltage VB3 of the battery cell B3 in the same way in subsequent periods P4, P5, and P6.

In the self-diagnostic mode shown in FIG. 3, the control circuit 6, firstly, turns on the switch SW5c of the reference voltage selection circuit 5, turns off the switch SW5d, and selects and outputs the first reference voltage VREF. The control circuit 6 turns on the third switch SW3, and turns on one of the switches SWB0 to SWB4, for example, the switch SWB4, thereby setting charge in the first capacitor C1 (period P11). Subsequently, the control circuit 6 turns off the switch SW5c and third switch SW3 (non-overlap period P12), turns on the switch SW5d, and selects the second reference voltage VSLF, thereby carrying out a charge redistribution (period P13).

A general expression for a conservation of charge between period P12 and period P13 is Expression (3). When the switch SWB4 is turned on, Vn=V4, but the terms C1Vn on either side are cancelled out.

$$C1(Vn-VREF)=C1(Vn-VSLF)+C2(VOUT-VSLF) \quad (3)$$

Expression (4) is obtained by solving Expression (3).

$$VOUT=C1/C2(VSLF-VREF)+VSLF \quad (4)$$

The A/D converter 3, after a switching to period P13, A/D converts a stabilized output voltage VOUT of the operational amplifier 4 expressed by Expression (4). The control circuit 6 carries out a fault diagnosis based on this A/D converted value. FIG. 4 shows post-fault capacitance values and output voltages VOUT in the self-diagnostic mode when each of the capacitors C1 and C2 is configured so as to have 1 pF by coupling three 3 pF capacitor elements in series, wherein the first reference voltage VREF is set to 0.5V, and the second reference voltage VSLF is set to 1V.

In FIG. 4, case IVa is a case in which there is no fault in the capacitor C1 or C2, case IVb is a case in which there is a short-circuit fault in one of the series capacitor elements configuring the capacitor C1, case IVc is a case in which there is a short-circuit fault in two of the series capacitor elements configuring the capacitor C1, case IVd is a case in which there is a short-circuit fault in one of the series capacitor elements configuring the capacitor C2, and case IVe is a case in which there is a short-circuit fault in two of the series capacitor elements configuring the capacitor C2.

All the cases differ in a post-fault capacitance ratio C1/C2. For this reason, the output voltage VOUT in one case always differs from that in another, provided that the first reference voltage VREF and second reference voltage VSLF are set to differing voltage values, as derived from Expression (4). Consequently, the control circuit 6, by storing in advance an A/D converted value (an index value) corresponding to each voltage value shown in FIG. 4, and comparing A/D converted values obtained in the self-diagnostic mode with the index values, can detect what degree of short-circuit fault has occurred in which capacitor. Also, the control circuit 6, by storing in advance a ratio (an index ratio) between a voltage value at each fault shown in FIG. 4 and a voltage value when there is no fault, and comparing ratios between A/D converted values at the previous self-diagnosis and A/D converted values at the current self-diagnosis with the index ratios, can detect what degree of short-circuit fault has occurred in which capacitor.

Furthermore, the control circuit 6 controls the order of execution of the voltage detection mode and self-diagnostic mode. There is, for example, a method of, after having detected the voltages VBn of the battery cells B4, B3, B2, and B1 in the voltage detection mode, switching to the self-diagnostic mode, and switching to the voltage detection mode again after the self-diagnosis. In this switching control, as the time interval between self-diagnoses is long, the average time interval between cell voltage VBn detections is short. However, when a fault is detected in the self-diagnostic mode, it is necessary to discard voltages VB4 to VB1 detected before that. As opposed to this, there is also a method of carrying out a self-diagnosis each time one cell voltage VBn is detected. In this switching control, the average time interval between cell voltage VBn detections is long but, when a fault is detected in the self-diagnostic mode, it is sufficient to discard only the voltage VBn detected immediately before that.

As described above, according to the embodiment, as the first and second capacitors C1 and C2 are configured by coupling a plurality of capacitor elements in series, an all-short-circuit fault, wherein the terminals of the first and second capacitors are all short-circuited, is less likely to occur, and it is possible to enhance the reliability of the voltage detection device 2. The voltage detection device 2 includes the self-diagnostic mode which detects a short-circuit fault in the first and second capacitors C1 and C2, apart from the voltage detection mode which detects the voltage of each battery cell Bn configuring the assembled battery 1. Because it is possible, in this self-diagnostic mode, to diagnose even a specific fault condition which has occurred in the first and second capacitors C1 and C2, it is possible to obtain a high degree of reliability of a detected voltage.

Second Embodiment

Next, a description will be given, while referring to FIGS. 5 to 8A and 8B, of a second embodiment.

A voltage detection device 11 of the present embodiment is such that the voltage detection device 2 of the first embodiment is turned into a fully differential type using a differential output type operational amplifier 12. The operational amplifier 12 outputs differential voltages VOP and VOM from its non-inverting output terminal and inverting output terminal respectively. The differential voltages VOP and VOM output from the output terminals TP and TM are converted to digital data by a differential input type A/D converter 13.

Battery cells Bn (n=1, 2, 3, and 4) of the assembled battery 1 in the present embodiment are coupled in series by one terminal, or the other terminal, of a battery cell Bn being coupled respectively to one terminal, or the other terminal, of another battery cell Bn. For example, a high potential side terminal of each battery cell B2 and B4 is taken to be one terminal, and a low potential side terminal thereof is taken to be the other terminal, while a high potential side terminal of each battery cell B1 and B3 is taken to be the other terminal, and a low potential side terminal thereof is taken to be one terminal. This distinction of the terminals is necessary in connection with the connection of switches SWBn (n=0, 1, 2, 3, and 4) to common lines CL1 and CL2 (first and second common nodes), and with the voltage output polarity of the operational amplifier 12.

The switches SWB0, SWB2, and SWB4 are coupled respectively between the terminals TB0, TB2, and TB4 and the common line CL1. Meanwhile, the switches SWB1 and SWB3 are coupled respectively between the terminals TB1 and TB3 and the common line CL2. A switch SWBx (x is one of 0, 2, and 4) coupled on the one terminal side of each battery cell Bn corresponds to a first switch, and a switch SWBx (x is one of 1 and 3) coupled on the other terminal side corresponds to a second switch, for each battery cell Bn. That is, the first switch is coupled between the one terminal of each battery cell Bn and the common line CL1, and the second switch is coupled between the other terminal of the battery cell Bn and the common line CL2.

By providing the switches SWBn in this way, it is possible to use the first switch of a battery cell Bn and the first switch of an adjacent battery cell Bn+1 or Bn−1 in common, and it is possible to use the second switch of a battery cell Bn and the second switch of an adjacent battery cell Bn+1 or Bn−1 in common. Because of this, it is possible to reduce the number of first and second switches by approximately half.

A capacitor C1A is coupled between the common line CL1 and an inverting input terminal of the operational amplifier 12. A capacitor C1B is coupled between the common line CL2 and a non-inverting input terminal of the operational amplifier 12. A capacitor C2A and a switch SW4A are coupled in series between the inverting input terminal and a non-inverting output terminal of the operational amplifier 12, and a switch SW3A is coupled in parallel to this series circuit. A capacitor C2B and a switch SW4B are coupled in series between the non-inverting input terminal and an inverting output terminal of the operational amplifier 12, and a switch SW3B is coupled in parallel to this series circuit. A switch SW5 is coupled between the common lines CL1 and CL2.

A first reference voltage selection circuit 5A is configured so as to be able to output a reference voltage VA and a reference voltage VC to a connection point of the capacitor C2A and switch SW4A via switches SW51 and SW53. A second reference voltage selection circuit 5B is configured so as to be able to output a reference voltage VB and a reference voltage VD to a connection point of the capacitor C2B and switch SW4B via switches SW52 and SW54.

An inverting circuit 14 which inverts the polarity of differential output voltages output from the non-inverting output terminal and inverting output terminal of the operational amplifier 12 is provided between the operational amplifier 12 and the output terminals TP and TM. That is, the non-inverting output terminal of the operational amplifier 12 is coupled to the output terminals TP and TM via switches SW141 and SW143, and the inverting output terminal of the operational amplifier 12 is coupled to the output terminals TM and TP via switches SW142 and SW144.

When detecting an interterminal voltage of each battery cell B2 and B4 whose high potential side terminal is the one terminal, the switches SW141 and SW142 are turned on, causing a non-inverting operation, and when detecting an interterminal voltage of each battery cell B1 and B3 whose high potential side terminal is the other terminal, the switches SW143 and SW144 are turned on, causing an inverting operation. Each of the above-described switches is configured of an MOS transistor, and a switching of these switches is carried out by the control circuit 6.

Figure 6:
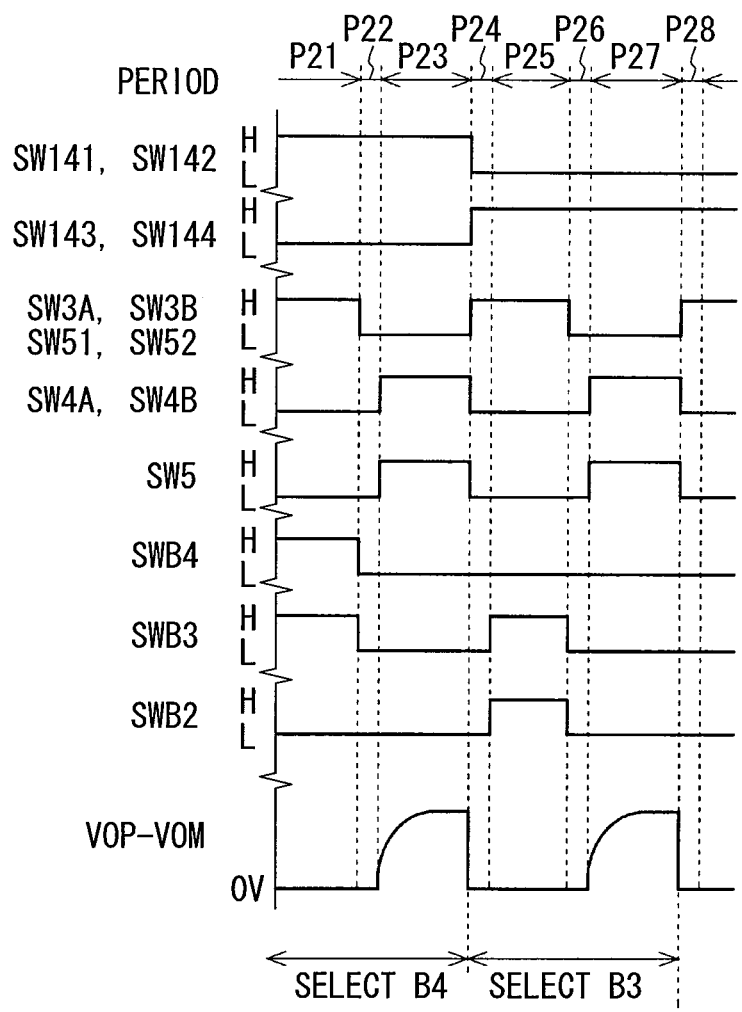
FIG. 6 is a diagram showing conditions of switches and a waveform of an output voltage, in the voltage detection mode, of the voltage detection device according to the second embodiment.
Figure 7:
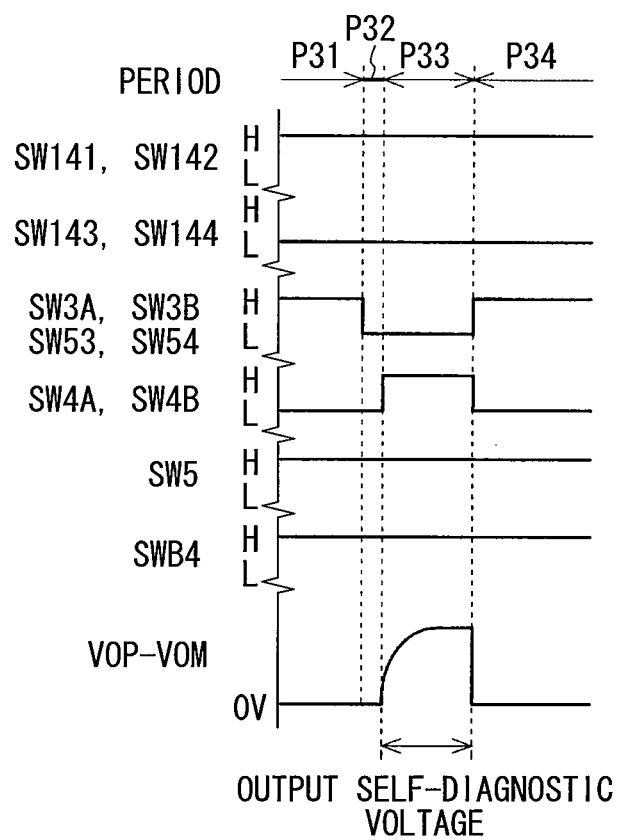
FIG. 7 is a diagram showing conditions of switches and a waveform of an output voltage, in the self-diagnostic mode, of the voltage detection voltage according to the second embodiment.

Next, a description will be given, while referring to FIGS. 6 to 8A and 8B, of operations and advantages of the present embodiment. FIGS. 6 and 7 each show ON and OFF conditions of the switches, and a waveform of an output voltage VOUT (=VOP−VOM), in the voltage detection mode and the self-diagnostic mode. The switches not described in the drawings are OFF.

In the voltage detection mode shown in FIG. 6, the control circuit 6 repeatedly detects the cell voltages VB1 to VB4 in descending order while switching switches, and outputs them to the A/D converter 13. In the present embodiment, because the reference voltage VC and reference voltage VD are not used in this mode, the switches SW53 and SW54 are maintained in the OFF condition.

The control circuit 6, when detecting the voltage VB4 of the battery cell B4, switches SW141 to SW144, thus bringing the inverting circuit 14 into non-inverting operation, turns off the switches SW4A, SW4B, and SW5, and turns on the switches SW51, SW52, SW3A, SW3B, SWB3, and SWB4, thereby setting charge in the capacitors C1A, C1B, C2A, and C2B (period P21). Subsequently, the control circuit 6 turns off the switches SW3A, SW3B, SWB3, and SWB4 as well as stopping an application of the reference voltages VA and VB by turning off the switches SW51 and SW52 (non-overlap period P22), and turns on the switches SW4A, SW4B, and SW5 (period P23).

General expressions for a conservation of charge between period P22 and period P23 are Expression (5), Expression (6), and Expression (7) when the capacities of the capacitors C1A, C1B, C2A, and C2B are taken to be C1A, C1B, C2A, and C2B respectively, a common mode voltage of the operational amplifier 12 is taken to be VCOM, a voltage of the common lines CL1 and CL2 when the switch SW5 is turned on is taken to be VY, and the voltage of the input terminals of the operational amplifier 12 is taken to be VX. When detecting in, for example, the battery cell B4, Vn=V4, Vn−1=V3, and Vn−Vn−1=VB4.

$$C1A(Vn-VCOM)+C2A(VA-VCOM)=C1A(VY-VX)+C2A(VOP-VX) \quad (5)$$

$$C1B(Vn-1-VCOM)+C2B(VB-VCOM)=C1B(VY-VX)+C2B(VOM-VX) \quad (6)$$

$$C1A(VCOM-Vn)+C1B(VCOM-Vn-1)=(C1A+C1B)(VX-VY) \quad (7)$$

Expression (8) is obtained by solving these Expressions.

$$VOP-VOM = \frac{C1A \cdot C1B}{C1A+C1B} \frac{C2A+C2B}{C2A \cdot C2B}(Vn-Vn-1)+VA-VB \quad (8)$$

The A/D converter 13, after a switching to period P23, A/D converts a stabilized output voltage VOUT of the operational amplifier 12 expressed by Expression (8). The control circuit 6 can detect the cell voltage VB4 based on this A/D converted value. Continuing, the control circuit 6, by turning off the switches SW141, SW142, SW4A, SW4B, and SW5, and turning on the switches SW143, SW144, SW51, SW52, SW3A, and SW3B (non-overlap period P24), also detects the voltage VB3 of the battery cell B3 in the same way in subsequent periods P25, P26, and P27.

In the self-diagnostic mode shown in FIG. 7, because the reference voltage VA and reference voltage VB are not used, the control circuit 6 maintains the switches SW51 and SW52 in the OFF condition. Also, the control circuit 6, as well as coupling the common lines CL1 and CL2 by turning on the switch SW5, turns on one (herein, SWB4) of the switches SWB0 to SWB4 in order to fix the potential of this common line. Furthermore, the control circuit 6 switches SW141 to SW144, thereby bringing the inverting circuit 14 into non-inverting operation.

The control circuit 6 turns off the switches SW4A and SW4B, and turns on the switches SW53, SW54, SW3A, and SW3B, thereby setting charge in the capacitors CIA, C1B, C2A, and C2B (period P31). Subsequently, the control circuit 6, as well as stopping the application of the reference voltages VC and VD by turning off the switches SW53 and SW54, turns off SW3A and SW3B (non-overlap period P32), and turns on the switches SW4A and SW4B (period P33).

General expressions for a conservation of charge between period P32 and period P33 are Expression (9) and Expression (10) when the voltage of the common lines CL1 and CL2 is taken to be VY, and the voltage of the input terminals of the operational amplifier 12 is taken to be VX. Also, Expression (11) is true for a differential output.

$$C1A(Vn-VCOM)+C2A(VC-VCOM)=C1A(Vn-VX)+C2A(VOP-VX) \quad (9)$$

$$C1B(Vn-VCOM)+C2B(VD-VCOM)=C1B(Vn-VX)+C2B(VOM-VX) \quad (10)$$

$$VOP+VOM=2VCOM \quad (11)$$

Expression (12) is obtained by solving these Expressions.

$$VOP-VOM = 2\frac{C2A(C1B+C2B)VC - C2B(C1A+C2A)VD + (C1AC2B-C2AC1B)VCOM}{C2A(C1B+C2B)+C2B(C1A+C2A)} \quad (12)$$

The A/D converter 13, after a switching to period P33, A/D converts a stabilized output voltage VOUT of the operational amplifier 4 expressed by Expression (12). The control circuit 6 carries out a fault diagnosis based on this A/D converted value. In the examples shown in FIGS. 8A and 8B, the capacitors C1A, C1B, C2A, and C2B are each configured so as to have 1 pF by coupling three 3 pF capacitor elements in series. Also, in the example shown in FIG. 8A, it is assumed that VC=0V, and VD=VCOM=2.5V, and in the example shown in FIG. 8B, it is assumed that VC=0V, VD=1.25V, and VCOM=2.5V. Then, output voltages VOUT (=VOP−VOM) based on Expression (12) in the self-diagnostic mode of each case are shown.

Herein, each example shows a normal case without any fault and six cases in each of which a short-circuit fault has occurred in one of the capacitors C1A, C1B, C2A, and C2B. For example, "C1A 1" described in the drawings indicates that there is a short-circuit fault in one of the three series capacitor elements configuring the capacitor CIA. Also, "1 pF", "1.5 pF", and "3 pF" in the tables indicate the capacitance values of the capacitors C1A, C1B, C2A, and C2B in each case.

According to FIGS. 8A and 8B, it can be seen that the value of the output voltage VOUT differs in accordance with a fault condition in any case. Consequently, the control circuit 6 can detect what degree of short-circuit fault has occurred in which capacitor, based on a comparison with the A/D values (index values) or the ratios (index ratios), in the same way as in the first embodiment.

As the voltage detection device 11 of the present embodiment has a fully differential configuration, as described above, it is possible, in the voltage detection mode and the self-diagnostic mode, to remove common mode noise from the differential output voltage VOUT of the operational amplifier 12 not only when the common mode noise is superimposed on the assembled battery 1 when setting charge in the capacitors C1A, C1B, C2A, and C2B, but also when the common mode noise is superimposed on the assembled battery 1 when redistributing charge. Furthermore, because the circuit configuration is symmetrical, it is possible to cancel out an error caused by feed through which occurs when switching switches, and it is possible to carry out a higher accuracy voltage detection and fault diagnosis.

Because the first switch of a battery cell Bn and the first switch of an adjacent battery cell are used in common, and the second switch of a battery cell Bn and the second switch of an adjacent battery cell are used in common, it is possible to reduce the number of first and second switches by approximately half. The larger the number of cells configuring the assembled battery 1, the more the number of switches can be reduced. However, the inverting circuit 14 which inverts the polarity of the differential output voltage VOP−VOM output from the operational amplifier 12 is necessary. It is possible to obtain other operations and advantages the same as those of the first embodiment.

In the present embodiment, the capacitor C1A corresponds to a first upstream capacitor, the capacitor C1B corresponds to a second upstream capacitor, the capacitor C2A corresponds to a first downstream capacitor, and the capacitor C2B corresponds to a first downstream capacitor. Furthermore, the switch SW3A corresponds to a first parallel switch, the switch SW3B corresponds to a second parallel switch, the switch SW4A corresponds to a first series switch, the switch SW4B corresponds to a second series switch, and the switch SW5 corresponds to a node switch. Also, the reference voltage VA corresponds to a first reference voltage, the reference voltage VC corresponds to a second reference voltage, the reference voltage VB corresponds to a third reference voltage, and the reference voltage VD corresponds to a fourth reference voltage.

Third Embodiment

Figure 5:
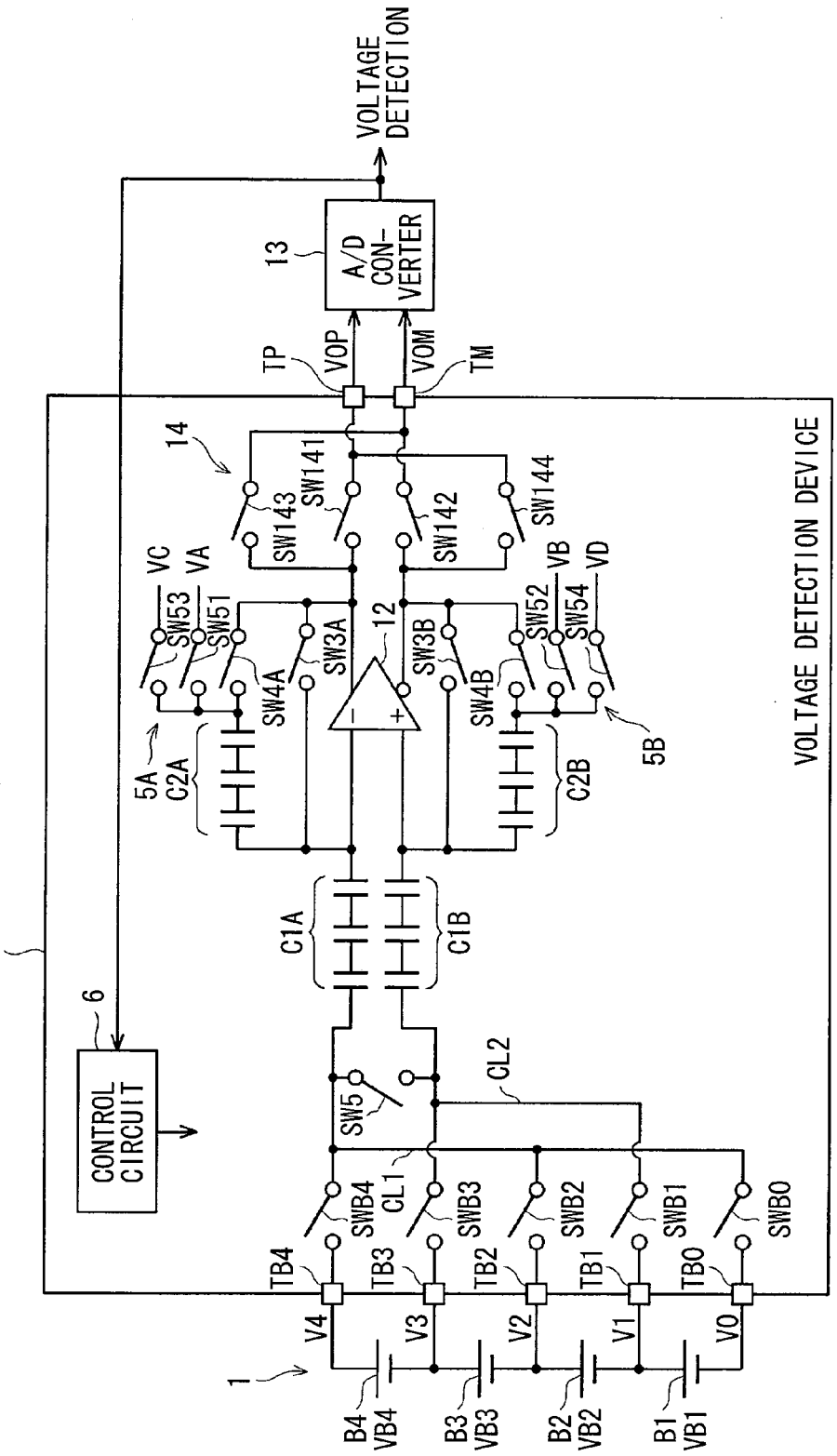
FIG. 5 is a diagram showing a voltage detection device according to a second embodiment of the present disclosure.
Figure 9:
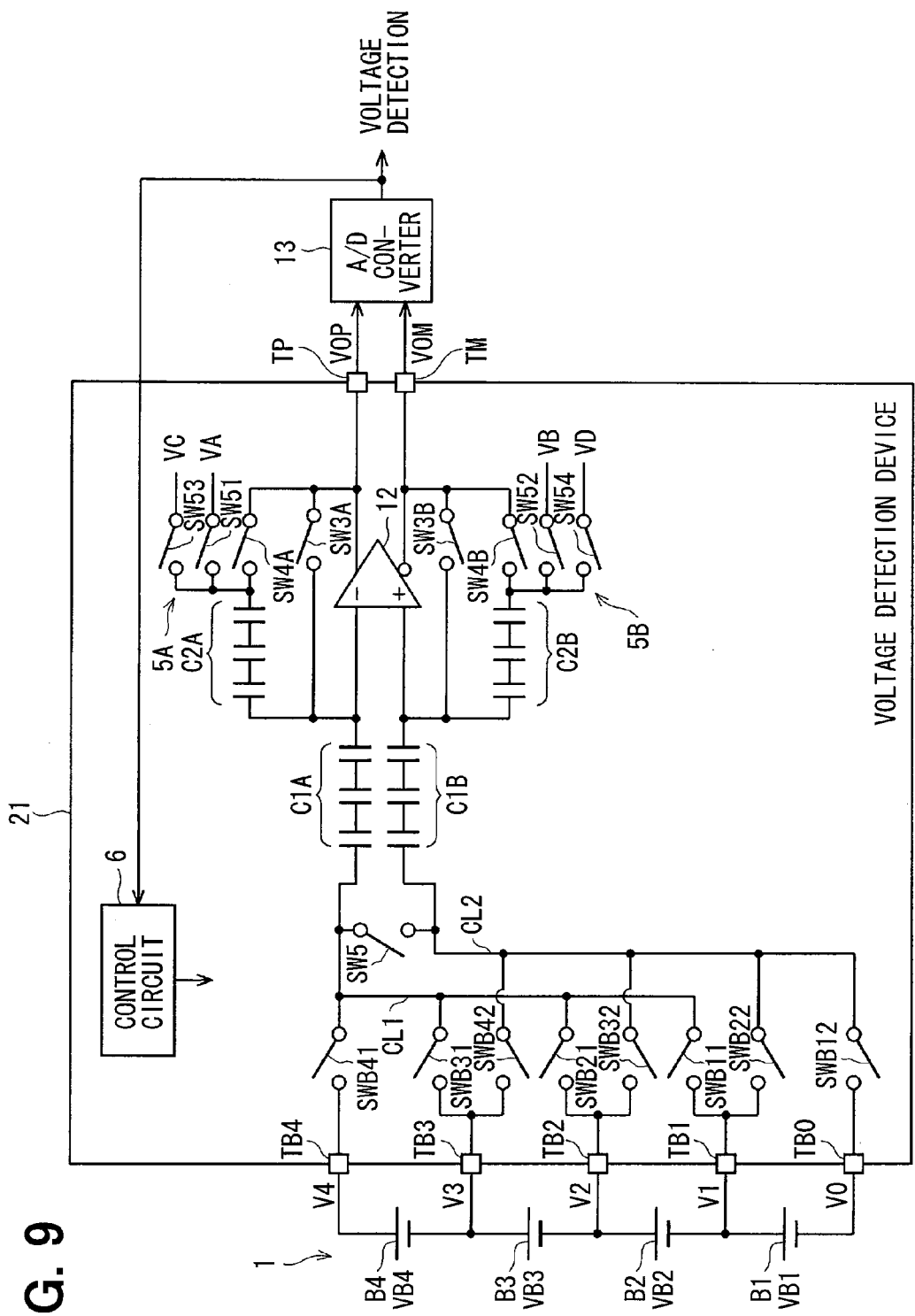
FIG. 9 is a diagram showing a voltage detection device according to a third embodiment of the present disclosure.

Next, a description will be given, while referring to FIGS. 9 to 11, of a third embodiment. A voltage detection device 21 of the present embodiment is such that the voltage detection device 11 shown in FIG. 5 is changed in the configuration of connection of the first switch and the second switch, eliminating the need for the inverting circuit 14. Hereafter, a description will be given of differing portions.

In the present embodiment, the high potential side terminal of each battery cell Bn (n=1, 2, 3, and 4) of the assembled battery 1 is taken to be one terminal, and the low potential side terminal is taken to be the other terminal. First switches SWBx1 are coupled respectively between terminals TBx (x=1, 2, 3, and 4) and the common line CL1, and second switches SWBy2 (y=1, 2, 3, and 4) are coupled respectively between terminals TBx (x=0, 1, 2, and 3) and the common line CL2.

That is, a first switch is coupled between the one terminal of a battery cell Bn and the common line CL1, and a second switch is coupled between the other terminal of the battery cell Bn and the common line CL2, in the same way as in the second embodiment. However, as adjacent battery cells Bn do not use the first and second switches in common, the number of first switches and the number of second switches each need to be a number equivalent to the number of cells. The inverting circuit 14 is no longer necessary because the polarity of the output voltage VOUT of the operational amplifier 12 is the same despite the battery cells Bn.

Figure 10:
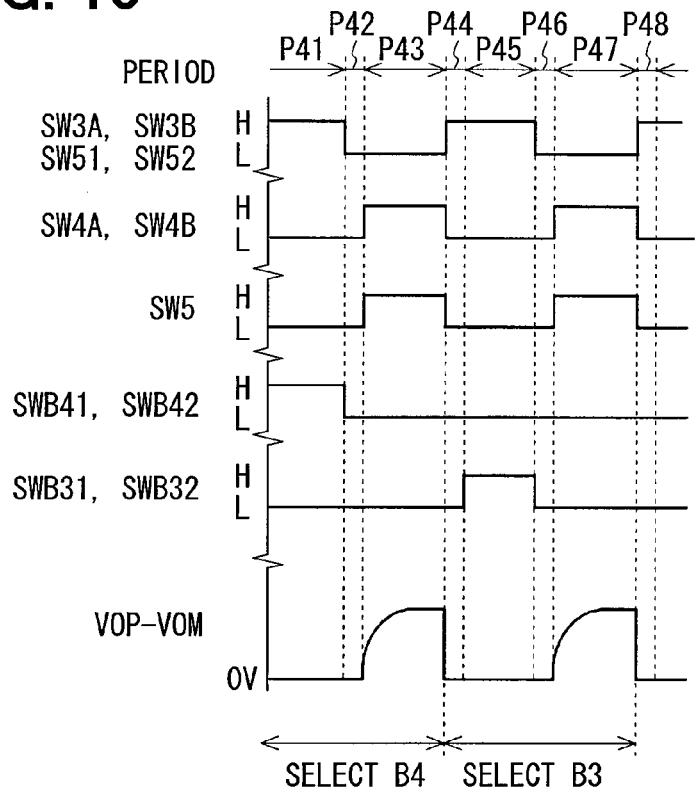
FIG. 10 is a diagram showing conditions of switches and a waveform of an output voltage, in the voltage detection mode, of the voltage detection device according to the third embodiment.
Figure 11:
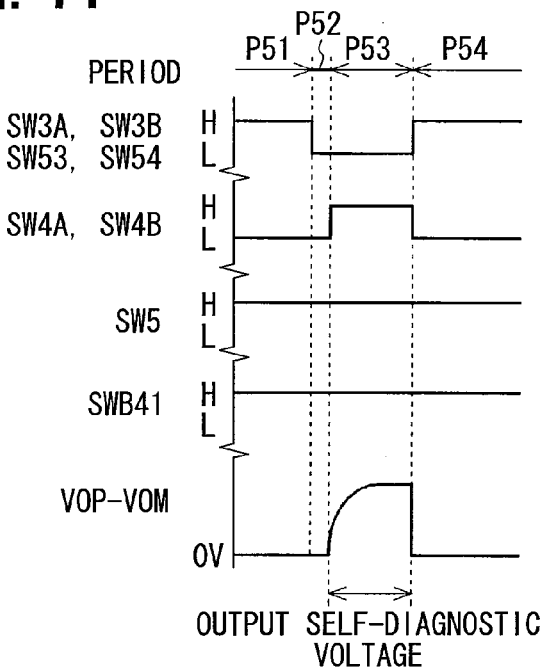
FIG. 11 is a diagram showing conditions of switches and a waveform of an output voltage, in the self-diagnostic mode, of the voltage detection device according to the third embodiment.

FIGS. 10 and 11 each show ON and OFF conditions of the switches, and a waveform of an output voltage VOUT (=VOP−VOM), in the voltage detection mode and self-diagnostic mode. The switches not described in the drawings are OFF.

In the voltage detection mode shown in FIG. 10, the control circuit 6, when detecting a voltage VB4 of the battery cell B4, turns on the first switch SWB41 and second switch SWB42, thereby carrying out a charge setting (period P41), and when detecting a voltage VB3 of the battery cell B3, turns on the first switch SWB31 and second switch SWB32, thereby carrying out a charge setting (period P45). Other operations (excluding that of the inverting circuit 14) are the same as the operations shown in FIG. 6.

In the self-diagnostic mode shown in FIG. 11, the control circuit 6 turns on one (herein, SWB41) of the switches SWB11 to SWB42 in order to fix the potentials of the common lines CL1 and CL2. Other operations (excluding that of the inverting circuit 14) are similar to the operations shown in FIG. 7.

Also according to the present embodiment, it is possible to obtain operations and advantages similar to those of the second embodiment. In the present embodiment, the first switch and the second switch are necessary for each battery cell Bn, but the inverting circuit 14 is no longer necessary.

Fourth Embodiment

Figure 12:
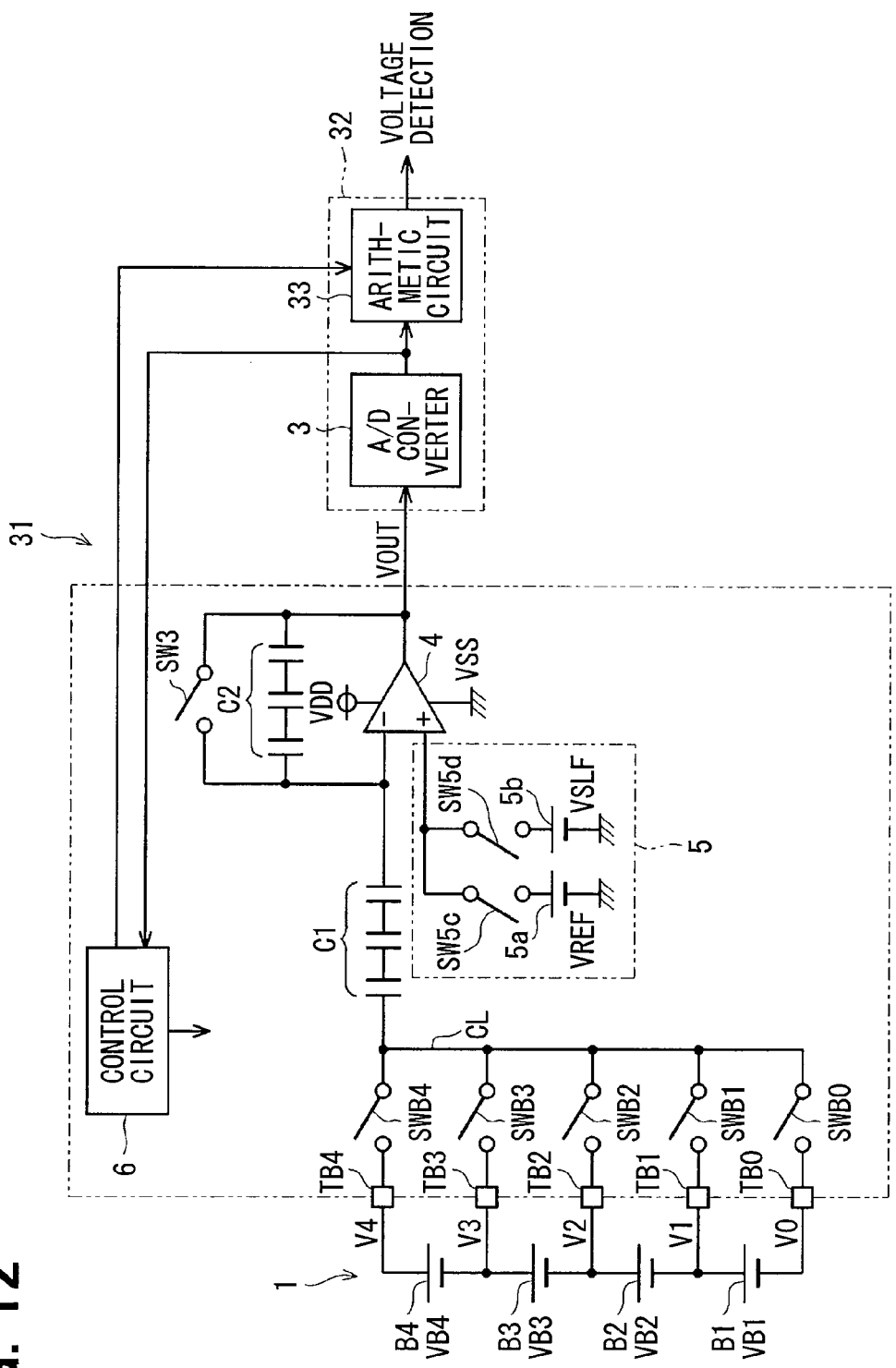
FIG. 12 is a diagram showing a voltage detection device according to a fourth embodiment of the present disclosure.
Figure 13:
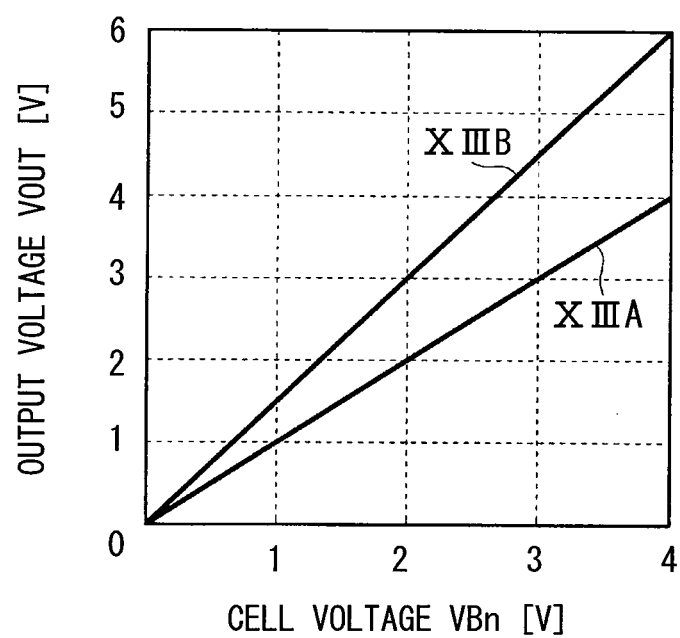
FIG. 13 is a diagram showing detected voltage characteristics when normal and when there is a short-circuit fault in the first capacitor.

Next, a description will be given, while referring to FIGS. 12 and 13, of a fourth embodiment. A voltage detection device 31 of the present embodiment, in contrast with the voltage detection device 2 shown in FIG. 1, includes a correction circuit 32 which corrects a detected voltage when there is a short-circuit fault in the first and second capacitors C1 and C2. The correction circuit 32 is configured of the A/D converter 3 with the output voltage VOUT of the operational amplifier 4 as an input, and a digital arithmetic circuit 33 which corrects an A/D converted value in accordance with a correction gain commanded by the control circuit 6.

When it is diagnosed in the self-diagnostic mode that a short-circuit fault has occurred in the capacitor C1 or C2, the control circuit 6 ascertains a capacitor in which the fault has occurred and a capacitor value after the fault, as described above. Input and output characteristics in the voltage detection mode are as shown by Expression (2). FIG. 13 shows detected voltage characteristics when the capacitors C1 and C2 are each configured so as to have 1 pF by coupling three 3 pF capacitor elements in series, and the first reference voltage VREF is taken to be 0V. A straight line XIIIA in the drawing indicates a case when normal, and a straight line XIIIB indicates a case in which there is a short-circuit fault in one of the series capacitor elements configuring the first capacitor C1.

In this case, an inclination, that is, a gain, of the output voltage VOUT with respect to a cell voltage VBn increases to $3/2$ times that when normal due to the fault. Then, the control circuit 6 determines a correction gain which corrects the output voltage VOUT of the operational amplifier 4 to an output voltage in a normal condition in which there is no short-circuit fault, and notifies the digital arithmetic circuit 33 of the correction circuit 32 of the correction gain in the voltage detection mode. In the above-described example, the control circuit 6 notifies the digital arithmetic circuit 33 of a $2/3$-time correction gain. According to the present embodiment, even though a partial short-circuit fault has occurred in the capacitor C1 and capacitor C2, it is possible to correct an output voltage in the voltage detection mode to a normal value before the fault.

Fifth Embodiment

Figure 14:
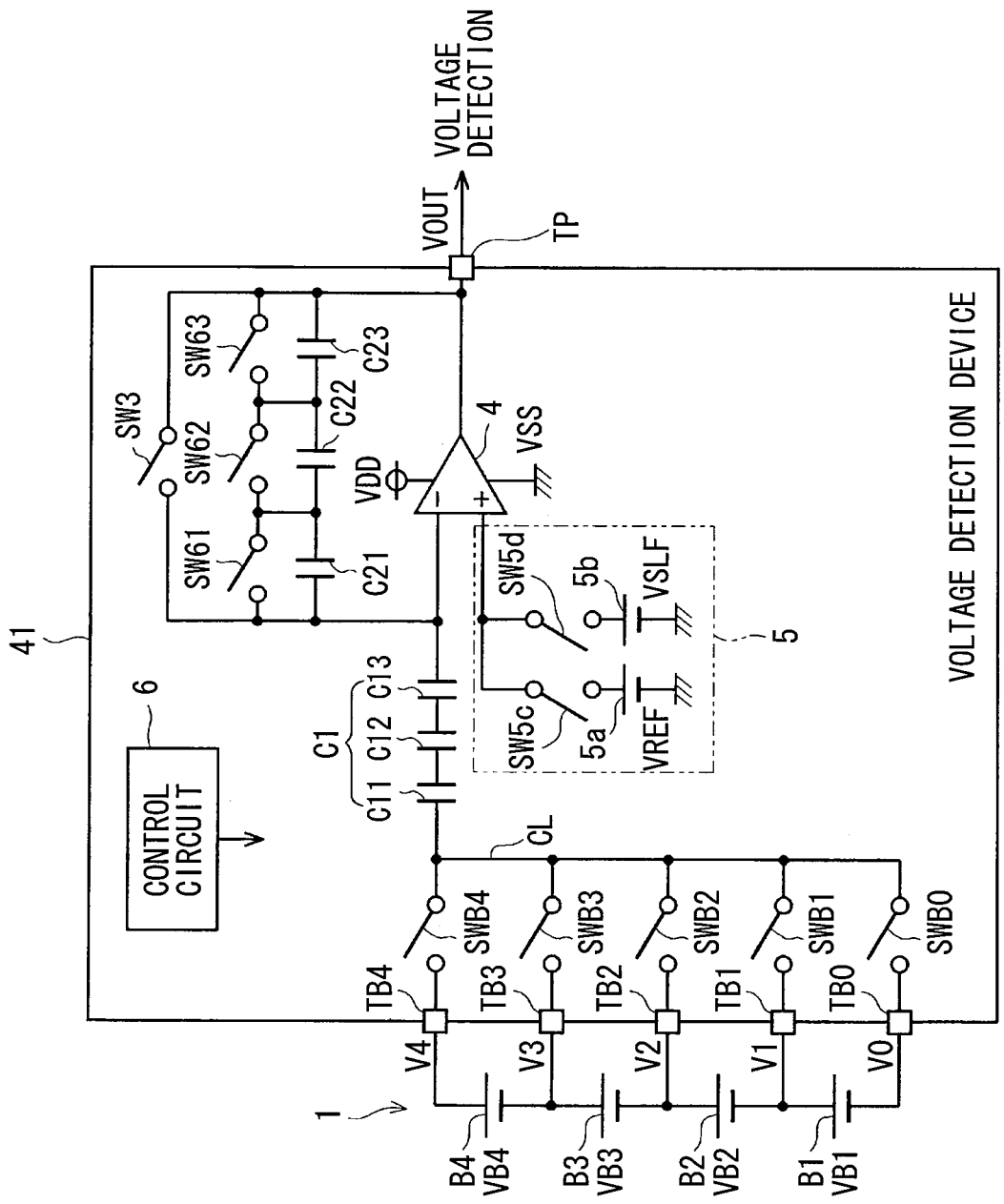
FIG. 14 is a diagram showing a voltage detection device according to a fifth embodiment of the present disclosure.

Next, a description will be given, while referring to FIG. 14, of a fifth embodiment.

A voltage detection device 41 of the present embodiment includes short-circuit switches SW61, SW62 and SW63 in parallel respectively with series capacitor elements C21, C22, and C23 configuring the second capacitor C2 of the voltage detection device 2 shown in FIG. 1. The switches SW61, SW62, and SW63 operate so as to be opened and closed in response to a compensation signal transmitted from the control circuit 6.

When it is diagnosed in the self-diagnostic mode that a short-circuit fault has occurred in one portion of the first capacitor C1, the control circuit 6 calculates a capacitance ratio between the first capacitor C1 and the second capacitor C2 before and after the fault, and determines a compensation signal so that the capacitance ratio before and after the fault is constant. For example, when it is diagnosed that a short-circuit fault has occurred in one of three series capacitor elements C11, C12, and C13, having the same capacitance value, which configure the capacitor C1, the capacitance value of the first capacitor C1 is 3⁄2 times that when normal. Then, the control circuit 6 gives an ON command to one of the switches SW61, SW62, and SW63, and also changes the capacitance value of the second capacitor C2 to 3⁄2 times that when normal.

As shown in Expression (2), the output voltage VOUT of the operational amplifier 4 when detecting a cell voltage VBn is proportional to C1/C2. Consequently, by short-circuiting one portion of the capacitor elements C21, C22, and C23 configuring the second capacitor C2 in accordance with the degree of a short-circuit fault in the first capacitor C1, it is possible to keep the capacitance ratio C1/C2 constant, and it is possible to normally detect a voltage after the fault too in the same way as before the fault.

Sixth Embodiment

A description will be given, while referring to FIGS. 15 and 16, of a sixth embodiment.

Figure 15:
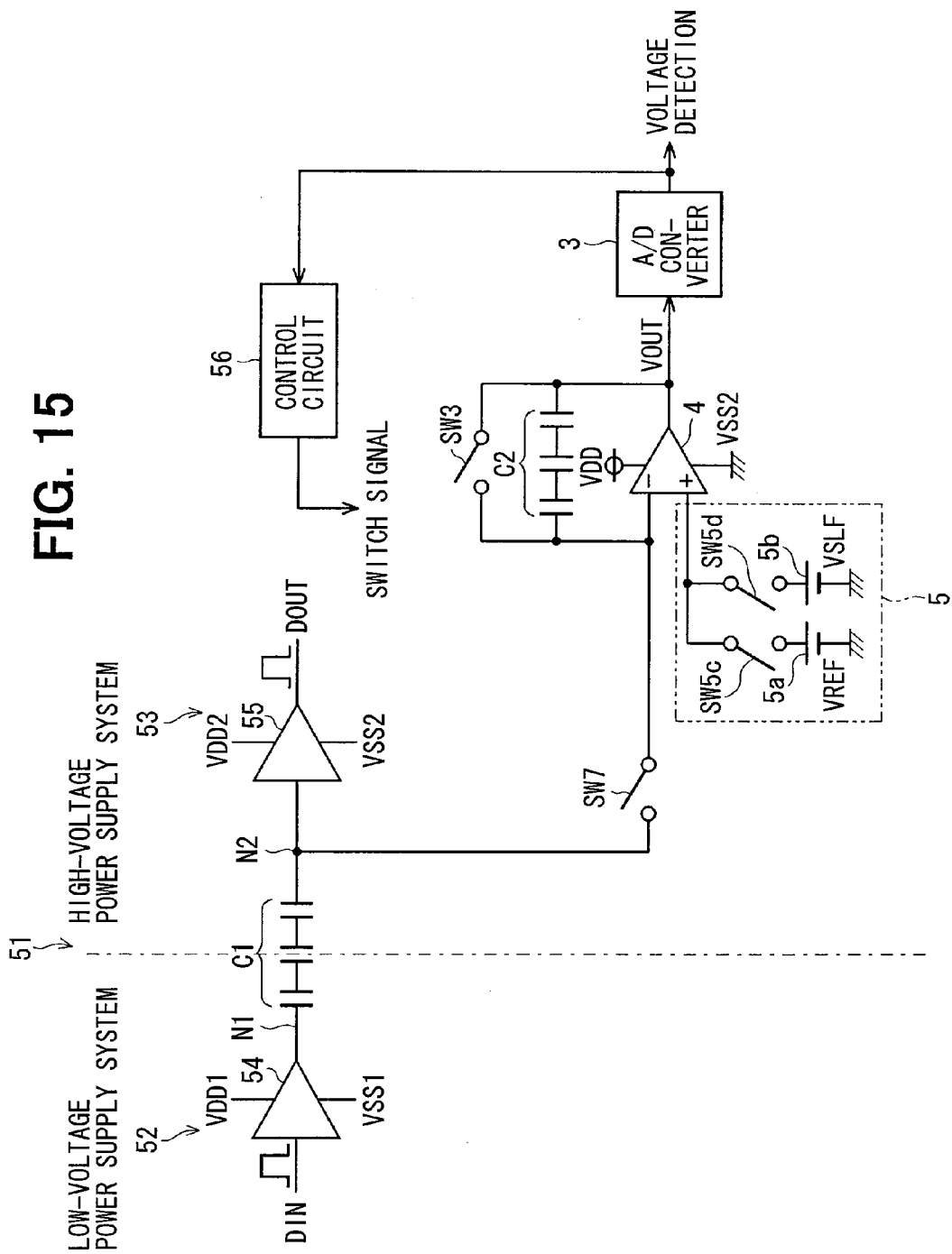
FIG. 15 is a diagram showing a level shift circuit according to a sixth embodiment of the present disclosure.

FIG. 15 shows a configuration of a level shift circuit. The level shift circuit 51 is a combination circuit which, in an IC chip, transmits digital data from a signal output node N1 of a first circuit 52 which operates in a low-voltage power supply system (a first power supply system) to a signal input node N2 of a second circuit 53 which operates in a high-voltage power supply system (a second power supply system). The first capacitor C1 is coupled between the signal output node N1 and the signal input node N2. The first capacitor C1 is configured by coupling a plurality of capacitor elements in series in order to prevent an all-short-circuit fault wherein all the terminals are short-circuited.

A driver 54 of the first circuit 52 operates in accordance with a power supply voltage VDD1 with a ground potential VSS1 as a reference. The driver 54 inputs data DIN, and outputs a voltage with a level VSS1 (an L level) or VDD1 (an H level) to the signal output node N1. An amplifier 55 of the second circuit 53 operates in accordance with a power supply voltage VDD2 with a ground potential VSS2 as a reference. Although not shown in the drawing, the amplifier 55 includes an amplifier which amplifies the voltage of the signal input node N2, a pair of comparators, one of which compares the amplified voltage with each of a rising edge detection threshold value and a trailing edge detection threshold value, and an RS flip-flop which is set or reset by an output signal of each comparator. The amplifier 55 outputs data DOUT with a voltage level VSS2 (an L level) or VDD2 (an H level).

The level shift circuit 51 operates in a signal transmission mode which transmits a signal from the signal output node N1 to the signal input node N2, and in the self-diagnostic mode which diagnoses a short-circuit fault in the capacitors C1 and C2. A circuit used in the self-diagnostic mode includes an operational amplifier 4 which operates by receiving a supply of a power supply voltage VDD with a ground potential VSS2 as a reference, the A/D converter 3, and a control circuit 56. The ground potential of the circuit is not limited to VSS2.

The reference voltage selection circuit 5 includes the reference voltage generation circuit 5a which generates the first reference voltage VREF, the reference voltage generation circuit 5b which generates the second reference voltage VSLF, and the switches SW5c and SW5d which select one of the reference voltages VREF and VSLF, and give the one selected to the non-inverting input terminal of the operational amplifier 4. The first reference voltage VREF and the second reference voltage VSLF are different voltage values.

A diagnostic switch SW7 is coupled between the signal input node N2 and the inverting input terminal of the operational amplifier 4. The second capacitor C2 and the third switch SW3 are coupled in parallel between the inverting input terminal and output terminal of the operational amplifier 4. The second capacitor C2 is also configured by coupling a plurality of capacitor elements in series. Each of the above-described switches is configured of an MOS transistor, and a switching of these switches is carried out by the control circuit 56 acting as a controller. The third switch SW3 corresponds to a parallel switch.

Next, a description will be given, while referring to FIG. 16, of operations and advantages of the present embodiment. The control circuit 56 turns off the diagnostic switch SW7 when in the signal transmission mode. In this mode, digital data are level shifted and transmitted from the first circuit 52 to the second circuit 53. Meanwhile, the control circuit 56 shifts to the self-diagnostic mode, immediately after a power supply and before a transmission of digital data is started, in a period for which no digital data are being transmitted.

Figure 16:
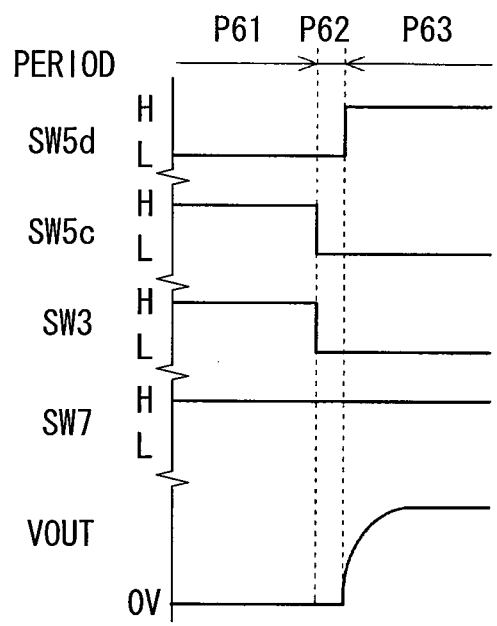
FIG. 16 is a diagram showing conditions of switches and a waveform of an output voltage, in the self-diagnostic mode, of the level shift circuit according to the sixth embodiment.

FIG. 16 shows ON and OFF conditions (an H level indicates the ON condition, and an L level indicates the OFF condition) of the switches, and a waveform of the output voltage VOUT, in the self-diagnostic mode. The control circuit 56, as well as causing a constant voltage (for example, VSS1 or VDD1) to be output from the first circuit 52 to the signal output node N1, turns on the switch SW5c, and turns off the switch SW5d, of the reference voltage selection circuit 5, thereby using the reference voltage selection circuit 5 to select and output the first reference voltage VREF. The control circuit 56 turns on the diagnostic switch SW7 and the third switch SW3, thereby setting charge in the first capacitor C1 (period P61). Subsequently, the control circuit 56 turns off the switch SW5c and the third switch SW3 (non-overlap period P62), and turns on the switch SW5d, thereby selecting the second reference voltage VSLF, and carrying out a charge redistribution (period P63).

A general expression for a conservation of charge between period P62 and period 63 is the above-described Expression (3), and an expression for the output voltage VOUT is Expression (4). The control circuit 56 carries out a fault diagnosis based on the A/D converted value of the output voltage VOUT. The relationship between short-circuit faults in the capacitors C1 and C2 and the output voltages VOUT, described using FIG. 4 in the first embodiment, has the same result in the present embodiment too. That is, as long as the first reference voltage VREF and second reference voltage VSLF are set to differing voltage values, the output voltage VOUT in one case always differs from that in another.

Consequently, in the same way as in the first embodiment, it is possible to detect what degree of short-circuit fault has occurred in which capacitor, by comparing the A/D converted values obtained in the self-diagnostic mode with the index values stored in advance. Also, it is possible to detect what degree of short-circuit fault has occurred in which capacitor, by comparing the ratios between the A/D converted values at the previous self-diagnosis and the A/D converted values at the current self-diagnosis with the index ratios stored in advance.

As described above, according to the present embodiment, because the first and second capacitors C1 and C2 are configured by coupling a plurality of capacitor elements in series, an all-short-circuit fault, wherein the terminals of the first and second capacitors C1 and C2 are all short-circuited, is less likely to occur. As a result of this, a data transmission function is easily maintained, and the voltage of the high-voltage power supply system is less likely to be applied to the first circuit 52. Consequently, it is possible to enhance the reliability of the level shift circuit 51.

The level shift circuit 51 includes, apart from the signal transmission mode which level shifts and transmits digital data, the self-diagnostic mode which detects a short-circuit fault in the first capacitor C1 and second capacitor C2. Because it is possible, in this self-diagnostic mode, to diagnose even a specific fault condition which has occurred in the first and second capacitors C1 and C2, it is possible to enhance the reliability of the level shift circuit 51 itself and the reliability of a signal transmission.

Seventh Embodiment

Figure 17:
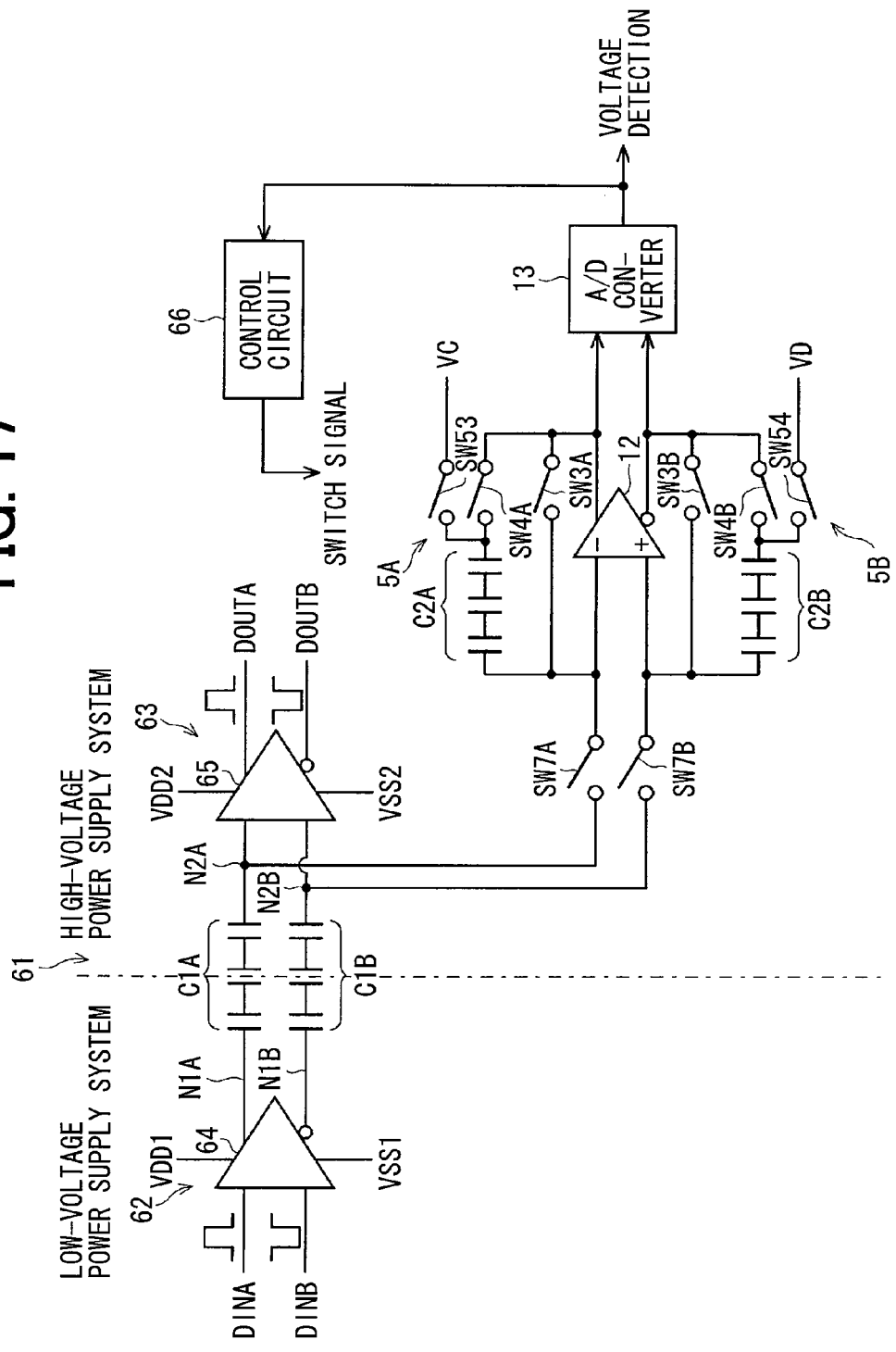
FIG. 17 is a diagram showing a level shift circuit according to a seventh embodiment of the present disclosure.

Next, a description will be given, while referring to FIGS. 17 and 18, of a seventh embodiment. A level shift circuit 61 of the present embodiment is a combination circuit wherein the level shift circuit 51 of the sixth embodiment is turned into a fully differential type. Capacitors C1A and C1B are coupled between signal output nodes N1A and N1B of a first circuit 62 and signal input nodes N2A and N2B of a second circuit 63. Each capacitor C1A and C1B is configured by coupling a plurality of capacitor elements in series.

A driver 64 of the first circuit 62 operates in accordance with the power supply voltage VDD1 with the ground potential VSS1 as a reference. The driver 64 inputs differential data DINA and DINB, and outputs a voltage with a level VSS1 or VDD1 to the signal output nodes N1A and N1B. An amplifier 65 of the second circuit 63 operates in accordance with a power supply voltage VDD2 with a ground potential VSS2 as a reference. The amplifier 65, in the same way as the amplifier 55, includes a differential amplifier, a comparator, and an RS flip-flop. The amplifier 65 outputs differential data DOUTA and DOUTB with a voltage level VSS2 or VDD2.

Diagnostic switches SW7A and SW7B are coupled between the signal input nodes N2A and N2B and the inverting input terminal and non-inverting input terminal of the operational amplifier 12 respectively. The capacitor C2A and the switch SW4A are coupled in series between the inverting input terminal and the non-inverting output terminal of the operational amplifier 12, and the switch SW3A is coupled in parallel to this series circuit. The capacitor C2B and the switch SW4B are coupled in series between the non-inverting input terminal and the inverting output terminal of the operational amplifier 12, and the switch SW3B is coupled in parallel to this series circuit. Each capacitor C2A and C2B is also configured by coupling a plurality of capacitor elements in series.

The first reference voltage selection circuit 5A is configured so as to be able to output the reference voltage VC via the switch SW53 to the connection point of the capacitor C2A and the switch SW4A. The second reference voltage selection circuit 5B is configured so as to be able to output the reference voltage VD via the switch SW54 to the connection point of the capacitor C2B and the switch SW4B. Each of the above-described switches is configured of an MOS transistor, and a switching of these switches is carried out by a control circuit 66.

Next, a description will be given, while referring to FIG. 18, of operations and advantages of the present embodiment. The control circuit 66 turns off the diagnostic switches SW7A and SW7B when in the signal transmission mode. In this mode, differential digital data are level shifted and transmitted from the first circuit 62 to the second circuit 63. Meanwhile, the control circuit 66 shifts to the self-diagnostic mode immediately after a supply of power and before a transmission of differential digital data is started, or the like, in a period for which no differential digital data are being transmitted.

Figure 18:
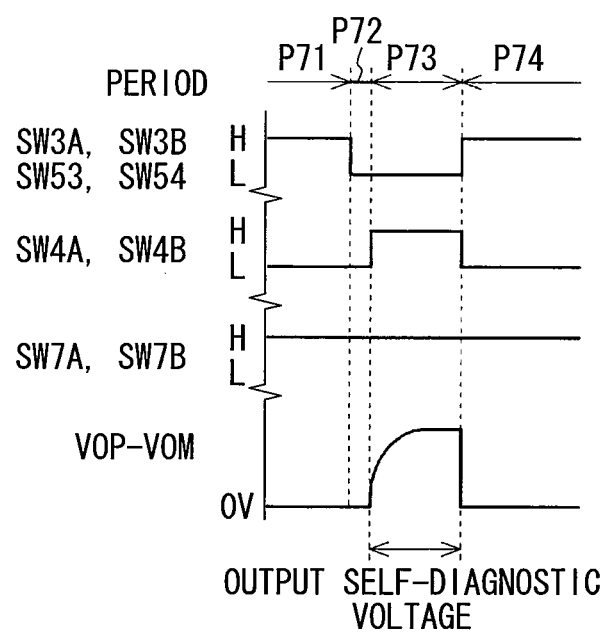
FIG. 18 is a diagram showing conditions of switches and a waveform of an output voltage, in the self-diagnostic mode, of the level shift circuit according to the seventh embodiment.

FIG. 18 shows ON and OFF conditions of the switches, and a waveform of the output voltage VOUT, in the self-diagnostic mode. The control circuit 66, as well as causing the same constant voltage (for example, VSS1 or VDD1) to be output from the first circuit 62 to the signal output nodes N1A and N1B, turns off the switches SW4A and SW4B, and turns on the switches SW7A, SW7B, SW53, SW54, SW3A, and SW3B, thereby setting charge in the capacitors C1A, C1B, C2A, and C2B (period P71). Subsequently, the control circuit 66, as well as stopping an application of the reference voltages VC and VD by turning off the switches SW53 and SW54, turns off the switches SW3A and SW3B (non-overlap period P72), and turns on the switches SW4A and SW4B (period P73).

General expressions for a conservation of charge between period P72 and period P73 are the above-described Expression (9) and Expression (10), and an expression for the output voltage VOUT (=VOP−VOM) is Expression (12). Vn used herein is the voltage of the signal output nodes N1A and N1B. The control circuit 66 carries out a fault diagnosis based on the A/D converted value of the output voltage VOUT. The relationship between short-circuit faults in the capacitors C1A, C1B, C2A, and C2B and output voltages VOUT, described using FIGS. 8A and 8B in the second embodiment, has the same result in the present embodiment too. Consequently, the control circuit 66 can detect what degree of short-circuit fault has occurred in which capacitor, based on a comparison with the A/D converted values (index values) or the ratios (index ratios), in the same way as in the sixth embodiment.

As described above, because the level shift circuit 61 of the present embodiment has a fully differential configuration, it is possible in the self-diagnostic mode to remove common mode noise from the differential output voltage VOUT of the operational amplifier 12 not only when the common mode noise is superimposed while setting charge in the capacitors C1A, C1B, C2A, and C2B, but also when the common mode noise is superimposed while redistributing charge. Furthermore, because the circuit configuration is symmetrical, it is possible to cancel out an error caused by feed through which occurs when switching each switch, and it is possible to carry out a higher-accuracy signal transmission and fault diagnosis. It is possible to obtain other operations and advantages the same as those in the sixth embodiment.

In the present embodiment, the capacitor C1A corresponds to a first upstream capacitor, the capacitor C1B corresponds to a second upstream capacitor, the capacitor C2A corresponds to a first downstream capacitor, and the capacitor C2B corresponds to a first downstream capacitor. Furthermore, the switch SW3A corresponds to a first parallel switch, the switch SW3B corresponds to a second parallel switch, the switch SW4A corresponds to a first series switch, and the switch SW4B corresponds to a second series switch. Also, the reference voltage VC corresponds to a first reference voltage, and the reference voltage VD corresponds to a second reference voltage.

Other Embodiments

A description has heretofore been given of preferred embodiments of the present invention, but the invention is not limited to the above-described embodiments, and it is possible to carry out various modifications and extensions without departing from the scope of the invention.

In the self-diagnostic mode of the first embodiment, the second reference voltage VSLF may be selected to set charge in the first capacitor C1 and second capacitor C2 in period P11 shown in FIG. 3, and the first reference voltage VREF may be selected to carry out a charge redistribution in period P13 after that. In other words, it is sufficient to use differing reference voltages between when setting charge and when redistributing charge. The sixth embodiment can also be modified in the same way.

In the second and third embodiments, charge is set using the reference voltages VA and VB in the voltage detection mode, and charge is set using the reference voltages VC and VD in the self-diagnostic mode. As opposed to this, it is also conceivable to use the reference voltage VA and reference voltage VC in common, and to use the reference voltage VB and reference voltage VD in common. For example, when it is assumed that VA=VC=0V and VB=VD=2.5V, each of the first reference voltage selection circuit 5A and the second reference voltage selection circuit 5B can be configured of one reference voltage generation circuit and one switch.

By the correction circuit 32 described in the fourth embodiment being provided in the second and third embodiments, it is possible, even though a partial short-circuit fault has occurred in the capacitors C1A, C1B, C2A, and C2B, to correct the output voltage in the voltage detection mode to a normal value before the fault. The correction circuit used in the fourth embodiment may include another circuit configuration, provided that it inputs the output voltage VOUT of the operational amplifier 4, and outputs a value wherein the output voltage VOUT is multiplied by a correction gain commanded by the control circuit 6.

In the fifth embodiment, a configuration may be adopted such that the switch SW3 is omitted, and all the switches SW61, SW62, and SW63 are turned on when the switch SW3 should be turned on. In the fifth embodiment, the short-circuit switches SW61 to SW63 are provided in parallel with the series capacitor elements C21 to C23 configuring the second capacitor C2, but this is because it is easier for a short-circuit fault to occur in the first capacitor C1 to which a high voltage is applied than in the second capacitor C2. When providing for a fault in the second capacitor C2 too, short-circuit switches may also be provided in the same way with respect to the series capacitor elements C11 to C13 configuring the first capacitor C1. When it is diagnosed that a short-circuit fault has occurred in a series capacitor configuring the second capacitor C2, the control circuit 6 gives ON and OFF commands to a corresponding short-circuit switch so that C1/C2 is constant. When there are circumstances wherein it is easier for a short-circuit fault to occur in the second capacitor C2 than in the first capacitor C1, short-circuit switches may be provided in parallel only with the series capacitor elements C11 to C13 configuring the first capacitor C1.

Also in the second and third embodiments, a short-circuit switch may be provided in parallel with each of a plurality of series coupled capacitor elements configuring at least the capacitors C2A and C2B, among the capacitors C1A and C1B and the capacitors C2A and C2B, in the same way as in the fifth embodiment, and an opening and closing of the short-circuit switches controlled in the same way as in the fifth embodiment. A voltage source other than the assembled battery may be used as a detection target voltage source.

In the first to fourth embodiments and the sixth and seventh embodiments, the capacitors C2, C2A, and C2B may be configured of one capacitor in place of a plurality of series coupled capacitor elements. This is because, as a voltage applied to the capacitors C2, C2A, and C2B is the power supply voltage causing the operational amplifiers 4 and 12 to operate or the reference voltage, a fault such as an insulating film short circuit is less likely to occur. Also according to the present modification example, a decrease in reliability is small. Also, it is possible to obtain the advantage of reducing a layout area.

In the self-diagnostic mode of the seventh embodiment, the same constant voltage is output from the first circuit 62 to the signal output nodes N1A and N1B, but differing constant voltages may be output. In the present case, the terms of the differing constant voltages are added to Expression (12). The configurations of the sixth and seventh embodiments can also be applied in the same way to a combination circuit with capacitive coupling, such as an isolator, apart from the level shift circuit.

Various aspects of the present disclosure will be shown hereafter.

A voltage detection apparatus according to one aspect of the present disclosure includes an operational amplifier, first to third switches, first and second capacitors, a reference voltage selection circuit, and a controller. The first switch is coupled between a high potential side terminal of a detection target voltage source and a common node. The second switch is coupled between a low potential side terminal of the detection target voltage source and the common node. The first capacitor includes a plurality of capacitor elements coupled in series between the common node and an inverting input terminal of the operational amplifier. The third switch is coupled between the inverting input terminal and an output terminal of the operational amplifier. The second capacitor is coupled between the inverting input terminal and output terminal of the operational amplifier. The reference voltage selection circuit selects one of a first reference voltage and a second reference voltage differing from one another, and applies a selected reference voltage to a non-inverting input terminal of the operational amplifier.

The controller can execute a voltage detection mode which detects the voltage of the detection target voltage source, and a self-diagnostic mode which detects a capacitor short-circuit fault. In the voltage detection mode, the controller uses the reference voltage selection circuit to select the first reference voltage and sets charge in the first capacitor by closing the third switch and closing the first switch. Subsequently, the controller opens the third switch, opens the first switch, and closes the second switch, thereby redistributing charge. When the capacitance values of the first and second capacitors are taken to be C1 and C2 respectively, and the first reference voltage is taken to be VREF, an output voltage of the operational amplifier induced by the charge redistribution is (C1/C2×voltage of detection target voltage source+VREF), meaning that it is possible, based on the output voltage, to detect an interterminal voltage of the detection target voltage source.

Meanwhile, in the self-diagnostic mode, the controller uses the reference voltage selection circuit to select one of the first reference voltage and the second reference voltage and sets charge in the first capacitor by closing the third switching and closing one of the first switch and the second switch. Subsequently, the controller opens the third switch, and uses the reference voltage selection circuit to select the other one of the first reference voltage and second voltage, thereby redistributing charge. When the second reference voltage is taken to be VSLF, an output voltage of the operational amplifier induced by a charge distribution when first selecting the first reference voltage is (C1/C2×(VSLF−VREF)+VSLF). Because the output voltage does not depend on the voltage of the detection target voltage source, it is possible to diagnose a change in the capacitance ratio between the first capacitor and the second capacitor, that is, a capacitor short-circuit fault, as long as the first and second reference voltages are correct.

According to the present aspect, as the first capacitor is configured by coupling a plurality of capacitors in series, the terminal voltage of the detection target voltage source is not applied directly to the operational amplifier even when there is a short-circuit fault in one portion of the capacitors. Also, it is possible to self-diagnose a short-circuit fault in the capacitors. Consequently, it is possible to enhance the reliability of the voltage detection apparatus itself and the reliability of a detected voltage.

The detection target voltage source may be unit batteries which configure an assembled battery by being coupled in series with the same polarity. In order to detect the voltage of each of the unit batteries, the first and second switches are necessary for each unit battery but, because the first and second switches coupling with the common connection nodes of adjacent unit batteries are coupled between the same nodes, they can be used in common. Therefore, the first and second switches may be used in common with the second and first switches of adjacent unit batteries for each unit battery. In the present case, the voltage of each unit battery configuring the assembled battery can be detected using an operational amplifier of a low withstand voltage.

The second capacitor may include a plurality of capacitor elements coupled in series. The voltage detection apparatus may further include a plurality of short-circuit switches coupled in parallel to the plurality of capacitor elements included in the second capacitor. When it is diagnosed in the self-diagnostic mode that a short-circuit fault has occurred in the first capacitor, the controller may calculate a capacitance ratio between the first capacitor and the second capacitor before and after the fault, and decide on a compensation signal such that the capacitance ratio before and after the fault is constant, and in the voltage detection mode, the controller may transmit the compensation signal to the plurality of short-circuit switches, and open and close the short-circuit switches in response to the compensation signal.

As described above, an output voltage of the operational amplifier after the charge redistribution in the voltage detection mode is proportional to the capacitance ratio C1/C2. Consequently, by short-circuiting one portion of the capacitor elements configuring the second capacitor in accordance with the degree of the short-circuit fault in the first capacitor, it is possible to keep the capacitance ratio C1/C2 constant, and it is also possible to normally detect a voltage after the fault in the same way as before the fault.

Alternatively, the second capacitor may include one capacitor element. As a voltage applied to the second capacitor is the power supply voltage causing the operational amplifier to operate or the reference voltage, it is conceivable that a fault such as an insulating film short circuit is less likely to occur. Consequently, it is possible to maintain reliability even when configuring the second capacitor of one capacitor, and it is possible to reduce a layout area.

The voltage detection apparatus may further include a correction circuit which receives an output voltage of the operational amplifier, and outputs a value wherein the output voltage is multiplied by a correction gain. When it is diagnosed in the self-diagnostic mode that a short-circuit fault has occurred in a capacitor, the controller may ascertain the capacitor in which the fault has occurred and a capacitance value after the fault, and based on a result thereof, determine a correction gain which corrects the output voltage of the operational amplifier to an output voltage in a condition in which there is no short-circuit fault, and in the voltage detection mode, the controller may notify the correction circuit of the correction gain. Because of this, it is possible, even though a partial short-circuit fault has occurred in each capacitor, to correct the output voltage in the voltage detection mode to a normal value before the fault.

The correction circuit may include an A/D converter with the operational amplifier output voltage as an input, and a digital arithmetic circuit which corrects a digital value output from the A/D converter in accordance with the commanded correction gain.

A voltage detection apparatus according to another aspect of the present disclosure includes an operational amplifier, first and second switches, first and second upstream capacitors, first and second downstream capacitors, first and second parallel switches, first and second series switches, a node switch, first and second reference voltage selection circuits, and a controller. The operational amplifier has a differential output configuration. The first switch is coupled between one terminal of a detection target voltage source and a first common node. The second switch is coupled between the other terminal of the detection target voltage source and a second common node. The first upstream capacitor includes a plurality of capacitor elements coupled in series between the first common node and an inverting input terminal of the operational amplifier. The second upstream capacitor includes a plurality of capacitor elements coupled in series between the second common node and a non-inverting input terminal of the operational amplifier. The first parallel switch is coupled between the inverting input terminal and a non-inverting output terminal of the operational amplifier. The second parallel switch is coupled between the non-inverting input terminal and an inverting output terminal of the operational amplifier. The first downstream capacitor and the first series switch are coupled in series between the inverting input terminal and non-inverting output terminal of the operational amplifier. The second downstream capacitor and the second series switch are coupled in series between the non-inverting input terminal and inverting output terminal of the operational amplifier. The node switch is coupled between the first common node and the second common node. The first reference voltage selection circuit can apply a first reference voltage or a second reference voltage to a common connection point of the first downstream capacitor and the first series switch. The second reference voltage selection circuit can apply a third reference voltage or a fourth reference voltage to a common connection point of the second downstream capacitor and the second series switch. The controller can select a voltage detection mode and a self-diagnostic mode.

In the voltage detection mode, the controller opens the first series switch, the second series switch, and the node switch, uses the first reference voltage selection circuit and the second reference voltage selection circuit to apply the first reference voltage and the third reference voltage respectively, and closes the first parallel switch and the second parallel switch and closes the first switch and second switch, thereby charging in the first upstream capacitor, the second upstream capacitor, the first downstream capacitor, and the second downstream capacitor, and subsequently, the controller detects an interterminal voltage of the detection target voltage source based on a differential output voltage of the operational amplifier after opening the first switch, the second switch, the first parallel switch, and the second parallel switch, stopping the voltage application using the first reference voltage selection circuit and second reference voltage selection circuit, and closing the first series switch, the second series switch, and the node switch. By so doing, charge is redistributed.

When the capacitance values of the first upstream capacitor, the second upstream capacitor, the first downstream capacitor, and the second downstream capacitor are taken to be C1A, C1B, C2A, and C2B respectively, and the first reference voltage and the third reference voltage are taken to be V1A and V1B respectively, a differential output voltage VOP−VOM of the operational amplifier induced by the charge redistribution is (C1A and C1B series capacitance values/series capacitance values of C2A and C2B)×voltage of detection target voltage source+(V1A−V1B), meaning that it is possible to detect an interterminal voltage of the detection target voltage source based on the output voltage.

In the self-diagnostic mode, the controller closes the node switch after having opened at least one of the first switch and the second switch, closes the first parallel switch and the second parallel switch, opens the first series switch and the second series switch, and uses the first reference voltage selection circuit and second reference voltage selection circuit to apply the second reference voltage and the fourth reference voltage respectively, thereby setting charge in the first upstream capacitor, the second upstream capacitor, the first downstream capacitor, and the second downstream capacitor, and subsequently, the controller carries out a fault diagnosis based on a differential output voltage of the operational amplifier after opening the first parallel switch and the second parallel switch, stopping the voltage application using the first reference voltage selection circuit and the second reference voltage selection circuit, and closing the first series switch and the second series switch. By so doing, charge is redistributed.

When the second reference voltage and the fourth reference voltage are taken to be V2A and V2B respectively, a differential output voltage VOP−VOM of the operational amplifier induced by the charge redistribution is fixed as a function of C1A, C1B, C2A, C2B, V2A, V2B, and a common mode voltage VCOM. As the differential output voltage does not depend on the voltage of the detection target voltage source, it is possible to arrange in such a way that differential output voltage values when there is a short-circuit fault in one portion of the above-mentioned capacitors differ from one another, meaning that it is possible to diagnose a capacitor short-circuit fault, provided that the first to fourth reference voltages are correct.

According to the present aspect, because the first and second upstream capacitors are configured by a plurality of capacitor elements being coupled in series, it is possible to enhance the reliability of the voltage detection apparatus itself and the reliability of a detected voltage. Also, by adopting a fully differential configuration, it is possible to remove common mode noise from the output voltage of the operational amplifier in whichever case the common mode noise is superimposed, when setting charge in the capacitors, or when redistributing charge, in the voltage detection mode and the self-diagnostic mode. Furthermore, because the circuit configuration is symmetrical, it is possible to cancel out an error caused by feed through which occurs when switching each switch, and it is possible to obtain a higher-accuracy detected voltage.

The detection target voltage source may be unit batteries which configure an assembled battery by being coupled in series with the same polarity. Adjacent unit batteries may form a series connection by one terminal, or the other terminal, of a unit battery being coupled respectively to one terminal, or the other terminal, of an adjacent battery. The first switch may be provided between one terminal of each unit battery and the first common node while being used in common with the first switch of an adjacent unit battery, and the second switch may be provided between the other terminal of each unit battery and the second common node while being used in common with the second switch of an adjacent unit battery. In the present case, the voltage of each unit battery configuring the assembled battery can be detected using a fully differential operational amplifier of a low withstand voltage.

Because it is possible, owing to the use in common, to reduce the total number of first switches and second switches by half, the larger the number of unit batteries configuring the assembled battery, the greater the advantage of reducing the switches. However, as the polarity with which adjacent unit batteries are coupled to the voltage detection apparatus is reversed, there may be provided an inverting circuit which inverts the polarity of a differential output voltage output from the operational amplifier. The controller may bring the inverting circuit into non-inverting operation when detecting an interterminal voltage of a unit battery whose high potential side terminal is one terminal, and bring the inverting circuit into inverting operation when detecting an interterminal voltage of a unit battery whose high potential side terminal is the other terminal.

Alternatively, the detection target voltage source may be unit batteries which configure an assembled battery by being coupled in series with the same polarity, and the first switch may be provided between a high potential side terminal of each unit battery and a first common node, and the second switch provided between a low potential side terminal of each unit battery and a second common node. In the present case, the voltage of each unit battery configuring the assembled battery can be detected using a fully differential operational amplifier of a low withstand voltage. Also, the first switch and the second switch are necessary for each of the unit batteries, but the above-described inverting circuit is no longer necessary.

Each of the first downstream capacitor and the second downstream capacitor may include a plurality of series coupled capacitor elements. Alternatively, each of the first downstream capacitor and the second downstream capacitor may include one capacitor element. It is conceivable that a fault such as an insulating film short circuit is less likely to occur because a voltage applied to the first downstream capacitor and second downstream capacitor is a power supply voltage causing the operational amplifier to operate or a reference voltage. Consequently, it is possible to maintain reliability even when each of the first downstream capacitor and the second downstream capacitor are configured of one capacitor element, and it is possible to reduce a layout area.

A combination circuit according to another aspect of the present disclosure includes first and second upstream capacitors, an operational amplifier, first and second diagnostic switches, first and second parallel switches, first and second series switches, first and second downstream capacitors, first and second reference voltage selection circuits, and a controller. Each of the first upstream capacitor and the second upstream capacitor includes a plurality of capacitor elements coupled in series between a differential signal output node of a first circuit which operates in a first power supply system and a differential signal input node of a second circuit which operates in a second power supply system. The operational amplifier has a differential output configuration. The first diagnostic switch is coupled between one of the differential signal input nodes and an inverting input terminal of the operational amplifier. The second diagnostic switch is coupled between the other one of the differential signal input nodes and a non-inverting input terminal of the operational amplifier. The first parallel switch is coupled between the inverting input terminal and a non-inverting output terminal of the operational amplifier. The second parallel switch is coupled between the non-inverting input terminal and an inverting output terminal of the operational amplifier. The first downstream capacitor includes one or a plurality of series capacitor elements. The first downstream capacitor and the first series switch are coupled between the inverting input terminal and non-inverting output terminal of the operational amplifier. The second downstream capacitor includes one or a plurality of series capacitor elements. The second downstream capacitor and the second series switch are coupled between the non-inverting input terminal and the inverting output terminal of the operational amplifier. The first reference voltage selection circuit can apply a first reference voltage to a common connection point of the first downstream capacitor and the first series switch. The second reference voltage selection circuit can apply a second reference voltage to a common connection point of the second downstream capacitor and second series switch.

The controller can execute a signal transmission mode which transmits a signal from the signal output node to the signal input node, and a self-diagnostic mode which detects a short-circuit fault in the capacitors. In the signal transmission mode, the controller opens the diagnostic switch. In the self-diagnostic mode, the controller outputs a constant voltage from the first circuit to the signal output node, uses the reference voltage selection circuit to select one of the first reference voltage and the second reference voltage, and closes the diagnostic switch and the third switch, thereby setting charge in the first capacitor. Subsequently, the controller opens the third switch, and uses the reference voltage selection circuit to select the other one of the first reference voltage and the second reference voltage, thereby redistributing charge. When the capacitance values of the first and second capacitors are taken to be $C1$ and $C2$ respectively, the first reference voltage is taken to be VREF, and the second reference voltage is taken to be VSLF, an output voltage of the operational amplifier induced by a charge redistribution when first selecting the first reference voltage is $(C1/C2 \times (VSLF-VREF)+VSLF)$. As the output voltage does not depend on the constant voltage output to the signal output node, it is possible to diagnose a change in the capacitance ratio between the first capacitor and second capacitor, that is, a capacitor short-circuit fault, provided that the first and second reference voltages are correct.

According to the present aspect, as the first capacitor is configured by a plurality of capacitors being coupled in series, it is possible to maintain the signal transmission even when there is a short-circuit fault in one portion of the capacitors, and it does not happen that a high voltage is applied to a low voltage circuit from a high voltage circuit. Also, it is possible to self-diagnose a short-circuit fault in the capacitors. Consequently, it is possible to enhance the reliability of the combination circuit itself and the reliability of the signal transmission.

A combination circuit according to another aspect of the present disclosure includes first and second upstream capacitors, an operational amplifier, first and second diagnostic switches, first and second parallel switches, first and second series switches, first and second downstream capacitors, first and second reference voltage selection circuits, and a controller. Each of the first upstream capacitor and the second upstream capacitor includes a plurality of capacitor elements coupled in series between a differential signal output node of a first circuit which operates in a first power supply system and a differential signal input node of a second circuit which operates in a second power supply system. The operational amplifier has a differential output configuration. The first diagnostic switch is coupled between one of the differential signal input nodes and an inverting input terminal of the operational amplifier. The second diagnostic switch is coupled between the other one of the differential signal input nodes and a non-inverting input terminal of the operational amplifier. The first parallel switch is coupled between the inverting input terminal and a non-inverting output terminal of the operational amplifier. The second parallel switch is coupled between the non-inverting input terminal and an inverting output terminal of the operational amplifier. The first downstream capacitor includes one or a plurality of series capacitor elements. The first downstream capacitor and the first series switch are coupled between the inverting input terminal and non-inverting output terminal of the operational amplifier. The second downstream capacitor includes one or a plurality of series capacitor elements. The second downstream capacitor and the second series switch are coupled between the non-inverting input terminal and inverting output terminal of the operational amplifier. The first reference voltage selection circuit can apply a first reference voltage to a common connection point of the first downstream capacitor and the first series switch. The second reference voltage selection circuit can apply a second reference voltage to a common connection point of the second downstream capacitor and the second series switch. The controller can select a signal transmission mode and a self-diagnostic mode.

In the signal transmission mode, the controller opens the first diagnostic switch and the second diagnostic switch, thereby transmitting a signal from the differential signal output node to the differential signal input node. In the self-diagnostic mode, the controller outputs a constant voltage from the first circuit to the differential signal output node, closes the first parallel switch and the second parallel switch, opens the first series switch and the second series switch, and uses the first reference voltage selection circuit and the second reference voltage selection circuit to apply the first reference voltage and second reference voltage respectively, thereby setting charge in the first upstream capacitor, the second upstream capacitor, the first downstream capacitor, and the second downstream capacitor, and subsequently, the controller, as well as opening the first parallel switch and second parallel switch, stops the voltage application using the first reference voltage selection circuit and the second reference voltage selection circuit, and closes the first series switch and the second series switch. By so doing, charge is redistributed.

When the capacitance values of the first upstream capacitor, the second upstream capacitor, the first downstream capacitor, and the second downstream capacitor are taken to be C1A, C1B, C2A, and C2B respectively, and the first reference voltage and the second reference voltage are taken to be V2A and V2B respectively, a differential output voltage VOP−VOM of the operational amplifier induced by a charge redistribution when outputting the same constant voltage to the pair of differential signal output nodes is fixed as a function of C1A, C1B, C2A, C2B, V2A, V2B, and a common mode voltage VCOM. Because the differential output voltage does not depend on the constant voltage output to the signal output nodes and it is possible to arrange in such a way that differential output voltage values when there is a short-circuit fault in one portion of the above-mentioned capacitors differ from one another, it is possible to diagnose a capacitor short-circuit fault as ling as the first and second reference voltages are correct. When differing constant voltages are output to the pair of differential signal output nodes, the differential output voltage depends on the constant voltages output to the signal output nodes.

According to this aspect, because the first upstream capacitor and the second upstream capacitor are configured by a plurality of capacitor elements being coupled in series, it is possible to enhance the reliability of the combination circuit itself and the reliability of the signal transmission. Also, by adopting a fully differential configuration, it is possible to remove common mode noise from the output voltage of the operational amplifier in whichever case the common mode noise is superimposed, when setting charge in the capacitors, or when distributing charge, in the self-diagnostic mode. Furthermore, as the circuit configuration is symmetrical, it is possible to cancel out an error caused by feed through which occurs when switching switches, and it is possible to obtain a higher-accuracy detected voltage.

What is claimed is:

1. A voltage detection apparatus, comprising:
   an operational amplifier;
   a first switch coupled between a high potential side terminal of a detection target voltage source and a common node;
   a second switch coupled between a low potential side terminal of the detection target voltage source and the common node;
   a first capacitor including a plurality of capacitor elements coupled in series between the common node and an inverting input terminal of the operational amplifier;
   a third switch coupled between the inverting input terminal and an output terminal of the operational amplifier;
   a second capacitor coupled between the inverting input terminal and output terminal of the operational amplifier;
   a reference voltage selection circuit which selects one of a first reference voltage and a second reference voltage differing from one another, and applies a selected reference voltage to a non-inverting input terminal of the operational amplifier; and
   a controller which is capable of selecting a voltage detection mode and a self-diagnostic mode, wherein
   in the voltage detection mode, the controller uses the reference voltage selection circuit to select the first reference voltage and sets charge in the first capacitor by closing the third switch and closing the first switch, and subsequently, the controller detects an interterminal voltage of the detection target voltage source based on an output voltage of the operational amplifier after opening the third switch and first switch and closing the second switch, and
   in the self-diagnostic mode, the controller uses the reference voltage selection circuit to select one of the first reference voltage and the second reference voltage and sets charge in the first capacitor by closing the third switching and closing one of the first switch and the second switch, and subsequently, the controller carries out a fault diagnosis based on an output voltage of the operational amplifier after opening the third switch and selecting the other one of the first reference voltage and second reference voltage using the reference voltage selection circuit.

2. The voltage detection apparatus according to claim 1, wherein
   the detection target voltage source includes a plurality of unit batteries which configures an assembled battery by being coupled in series with the same polarity, and
   the first switch and second switch of each of the unit batteries are used in common respectively with the second and first switch of an adjacent unit battery.

3. The voltage detection apparatus according to claim 1, wherein
   the second capacitor includes a plurality of capacitor elements coupled in series.

4. The voltage detection apparatus according to claim 3, further comprising:
   a plurality of short-circuit switches coupled in parallel to each of the plurality of capacitor elements included in the second capacitor, wherein
   when it is diagnosed in the self-diagnostic mode that a short-circuit fault has occurred in the first capacitor, the controller calculates a capacitance ratio between the first capacitor and second capacitor before and after the fault, and decides on a compensation signal such that the capacitance ratio before and after the fault is constant,
   in the voltage detection mode, the controller transmits the compensation signal to the plurality of short-circuit switches, and
   the plurality of short-circuit switches opens and closes in accordance with the compensation signal.

5. The voltage detection apparatus according to claim 1, wherein
   the second capacitor includes one capacitor element.

6. The voltage detection apparatus according to claim 1, further comprising:
   a correction circuit which receives an output voltage of the operational amplifier and outputs a value obtained by multiplying the output voltage by a correction gain, wherein
   when it is diagnosed in the self-diagnostic mode that a short-circuit fault has occurred in one of the capacitors, the controller ascertains a capacitor in which the fault has occurred and a capacitance value after the fault, and based on a result thereof, determines the correction gain which corrects the output voltage of the operational amplifier to an output voltage in a condition in which there is no short-circuit fault, and
   in the voltage detection mode, the controller notifies the correction circuit of the correction gain.

7. The voltage detection apparatus according to claim 6, wherein
   the correction circuit includes an A/D converter and a digital arithmetic circuit,
   the A/D converter digitally converts an output voltage received from the operational amplifier and outputs a digital value, and
   the digital arithmetic circuit corrects the digital value output from the A/D converter in accordance with the correction gain.

8. A voltage detection apparatus comprising:
   an operational amplifier having a differential output configuration;
   a first switch coupled between one terminal of a detection target voltage source and a first common node;
   a second switch coupled between the other terminal of the detection target voltage source and a second common node;
   a first upstream capacitor including a plurality of capacitor elements coupled in series between the first common node and an inverting input terminal of the operational amplifier;

a second upstream capacitor including a plurality of capacitor elements coupled in series between the second common node and a non-inverting input terminal of the operational amplifier;

a first parallel switch coupled between the inverting input terminal and a non-inverting output terminal of the operational amplifier;

a second parallel switch coupled between the non-inverting input terminal and an inverting output terminal of the operational amplifier;

a first downstream capacitor and a first series switch coupled in series between the inverting input terminal and the non-inverting output terminal of the operational amplifier;

a second downstream capacitor and a second series switch coupled in series between the non-inverting input terminal and the inverting output terminal of the operational amplifier;

a node switch coupled between the first common node and second common node;

a first reference voltage selection circuit which is capable of applying a first reference voltage or a second reference voltage to a common connection point of the first downstream capacitor and the first series switch;

a second reference voltage selection circuit which is capable of applying a third reference voltage and a fourth reference voltage to a common connection point of the second downstream capacitor and the second series switch; and a controller which is capable of selecting a voltage detection mode and a self-diagnostic mode, wherein in the voltage detection mode, the controller opens the first series switch, the second series switch, and the node switch, uses the first reference voltage selection circuit and the second reference voltage selection circuit to apply the first reference voltage and the third reference voltage respectively, and closes the first parallel switch and the second parallel switch and closes the first switch and the second switch, thereby charging in the first upstream capacitor, the second upstream capacitor, the first downstream capacitor, and the second downstream capacitor, and subsequently, the controller detects an interterminal voltage of the detection target voltage source based on a differential output voltage of the operational amplifier after opening the first switch, the second switch, the first parallel switch, and the second parallel switch, stopping the voltage application using the first reference voltage selection circuit and second reference voltage selection circuit, and closing the first series switch, the second series switch, and the node switch, and in the self-diagnostic mode, the controller closes the node switch after having opened at least one of the first switch and the second switch, closes the first parallel switch and the second parallel switch, opens the first series switch and the second series switch, and uses the first reference voltage selection circuit and second reference voltage selection circuit to apply the second reference voltage and the fourth reference voltage respectively, thereby setting charge in the first upstream capacitor, the second upstream capacitor, the first downstream capacitor, and the second downstream capacitor, and subsequently, the controller carries out a fault diagnosis based on a differential output voltage of the operational amplifier after opening the first parallel switch and the second parallel switch, stopping the voltage application using the first reference voltage selection circuit and the second reference voltage selection circuit, and closing the first series switch and the second series switch.

9. The voltage detection apparatus according to claim 8, further comprising:

an inverting circuit which inverts the polarity of a differential output voltage output from the non-inverting output terminal and the inverting output terminal of the operational amplifier, wherein the detection target voltage source is a plurality of unit batteries which configures an assembled battery by being coupled in series with the same polarity, adjacent unit batteries form a series connection by one terminal, or the other terminal, of an unit battery being coupled respectively to one terminal, or the other terminal, of an adjacent unit battery, the first switch is provided between one terminal of each of the unit batteries and the first common node while being used in common with the first switch of an adjacent unit battery, the second switch is provided between the other terminal of each of the unit batteries and the second common node while being used in common with the second switch of an adjacent unit battery, and the controller brings the inverting circuit into non-inverting operation when detecting an interterminal voltage of a unit battery whose high potential side terminal is the one terminal, and brings the inverting circuit into inverting operation when detecting an interterminal voltage of a unit battery whose high potential side terminal is the other terminal.

10. The voltage detection apparatus according to claim 8, wherein the detection target voltage source is a plurality of unit batteries which configures an assembled battery by being coupled in series with the same polarity, the first switch is provided between a high potential side terminal of each of the unit batteries and the first common node, and the second switch is provided between a low potential side terminal of each of the unit batteries and the second common node.

11. The voltage detection apparatus according to claim 8, wherein each of the first downstream capacitor and the second downstream capacitor includes a plurality of capacitor elements coupled in series.

12. The voltage detection apparatus according to claim 8, wherein each of the first downstream capacitor and second downstream capacitor includes one capacitor element.

13. A combination circuit, comprising:

a first capacitor including a plurality of capacitor elements coupled in series between a signal output node of a first circuit which operates in a first power supply system and a signal input node of a second circuit which operates in a second power supply system;

an operational amplifier;

a diagnostic switch coupled between the signal input node and an inverting input terminal of the operational amplifier;

a parallel switch coupled between the inverting input terminal and an output terminal of the operational amplifier;

a second capacitor including one capacitor coupled, or a plurality of capacitor elements coupled in series, between the inverting input terminal and the output terminal of the operational amplifier;

a reference voltage selection circuit which selects one of a first reference voltage and a second reference voltage differing from one another, and applies a selected reference voltage to a non-inverting input terminal of the operational amplifier; and a controller which is selectable a signal transmission mode and a self-diagnostic mode, wherein in the signal transmission mode, the controller opens the diagnostic switch, thereby transmitting a signal from the signal output node to the signal input node, and in the self-diagnostic mode, the controller outputs a constant voltage from the first circuit to the signal output node, uses the reference voltage selection circuit to select one of the first reference voltage and the second reference voltage, and closes the diagnostic switch and the third switch, thereby setting charge in the first capacitor, and subsequently, the controller carries out a fault diagnosis based on an output voltage of the operational amplifier after opening the third switch, and using the reference voltage selection circuit to select the other one of the first reference voltage and second reference voltage.

14. A combination circuit, comprising:

a first upstream capacitor and second upstream capacitor each including a plurality of capacitor elements coupled in series between a differential signal output node of a first circuit which operates in a first power supply system and a differential signal input node of a second circuit which operates in a second power supply system;

an operational amplifier having a differential output configuration;

a first diagnostic switch coupled between one of the differential signal input nodes and an inverting input terminal of the operational amplifier;

a second diagnostic switch coupled between the other one of the differential signal input nodes and a non-inverting input terminal of the operational amplifier;

a first parallel switch coupled between the inverting input terminal and a non-inverting output terminal of the operational amplifier;

a second parallel switch coupled between the non-inverting input terminal and an inverting output terminal of the operational amplifier;

a first downstream capacitor including one or a plurality of capacitor elements coupled in series, and a first series switch, coupled between the inverting input terminal and the non-inverting output terminal of the operational amplifier;

a second downstream capacitor including one or a plurality of capacitor elements coupled in series, and a second series switch, coupled between the non-inverting input terminal and the inverting output terminal of the operational amplifier;

a first reference voltage selection circuit which is capable of applying a first reference voltage to a common connection point of the first downstream capacitor and the first series switch;

a second reference voltage selection circuit which is capable of applying a second reference voltage to a common connection point of the second downstream capacitor and the second series switch; and a controller which is capable of selecting a signal transmission mode and a self-diagnostic mode, wherein in the signal transmission mode, the controller opens the first diagnostic switch and the second diagnostic switch, thereby transmitting a signal from the differential signal output node to the differential signal input node, and in the self-diagnostic mode, the controller outputs a constant voltage from the first circuit to the differential signal output node, closes the first parallel switch and second parallel switch, opens the first series switch and second series switch, and uses the first reference voltage selection circuit and the second reference voltage selection circuit to apply the first reference voltage and the second reference voltage respectively, thereby setting charge in the first upstream capacitor, the second upstream capacitor, the first downstream capacitor, and the second downstream capacitor, and subsequently, the controller carries out a fault diagnosis based on a differential output voltage of the operational amplifier after opening the first parallel switch and the second parallel switch, stopping the voltage application using the first reference voltage selection circuit and the second reference voltage selection circuit, and closing the first series switch and the second series switch.

\* \* \* \* \*